(12) United States Patent
Ikuta et al.

(10) Patent No.: US 7,298,231 B2
(45) Date of Patent: Nov. 20, 2007

(54) SURFACE ACOUSTIC WAVE DEVICE AND COMMUNICATION APPARATUS

(75) Inventors: Takanori Ikuta, Kyoto (JP); Wataru Koga, Kyoto (JP); Yuuko Yokota, Kyoto (JP)

(73) Assignee: Kyocera Corporation, Kyoto (JP)

( * ) Notice: Subject to any disclaimer, the term of this patent is extended or adjusted under 35 U.S.C. 154(b) by 71 days.

(21) Appl. No.: 11/139,024

(22) Filed: May 25, 2005

(65) Prior Publication Data

US 2005/0264375 A1 Dec. 1, 2005

(30) Foreign Application Priority Data

May 27, 2004 (JP) ............................ 2004-158442
Jun. 28, 2004 (JP) ............................ 2004-190460

(51) Int. Cl.
*H03H 9/72* (2006.01)
(52) U.S. Cl. ...................................... 333/133; 333/193
(58) Field of Classification Search ................. 333/133
See application file for complete search history.

(56) References Cited

U.S. PATENT DOCUMENTS

| | | | |
|---|---|---|---|
| 6,114,635 A * | 9/2000 | Lakin et al. ................ | 174/260 |
| 6,351,194 B2 | 2/2002 | Takahashi et al. | |
| 6,369,672 B1 * | 4/2002 | Ikada ........................ | 333/193 |
| 6,388,545 B1 * | 5/2002 | Kawachi et al. ............ | 333/193 |
| 6,489,860 B1 * | 12/2002 | Ohashi ....................... | 333/133 |
| 6,528,924 B1 | 3/2003 | Stelzl et al. | |
| 6,566,981 B2 * | 5/2003 | Urabe et al. ................ | 333/193 |
| 6,722,030 B1 | 4/2004 | Stelzl et al. | |
| 6,922,119 B2 | 7/2005 | Matsuta et al. | |
| 7,053,731 B2 * | 5/2006 | Iwamoto et al. ............ | 333/133 |
| 2003/0060172 A1 | 3/2003 | Kuriyama et al. | |
| 2004/0207485 A1 | 10/2004 | Kawachi et al. | |
| 2005/0116352 A1 | 6/2005 | Warashina et al. | |
| 2005/0264375 A1 | 12/2005 | Ikuta et al. | |

FOREIGN PATENT DOCUMENTS

| | | |
|---|---|---|
| JP | 04-293310 | 10/1992 |
| JP | 09-135143 | 5/1997 |
| JP | 11-510666 | 9/1999 |
| JP | 2000196407 A | 7/2000 |
| JP | 2002-504773 | 2/2002 |
| JP | 2005-102114 * | 4/2005 |
| JP | 2005167969 A | 6/2005 |

* cited by examiner

*Primary Examiner*—Barbara Summons
(74) *Attorney, Agent, or Firm*—Hogan & Hartson LLP

(57) ABSTRACT

In a surface acoustic wave device according to the present invention, a transmitting filter element TX and a receiving filter element RX are formed on one main surface of a piezoelectric substrate 300, and are mounted by face down on an upper surface of a circuit board 200. A ground electrode 322 in the receiving filter element RX is connected to three linear via conductors 221' formed on the circuit board 200, and a ground electrode 312 in the transmitting filter element TX is connected to a crank-shaped via conductor 211' formed on the circuit board 200.

20 Claims, 18 Drawing Sheets

IDT ELECTRODE    EQUIVALENT CIRCUIT

SURFACE ACOUSTIC WAVE DEVICE AND COMMUNICATION APPARATUS

BACKGROUND OF THE INVENTION

1. Field of the Invention

The present invention relates to a surface acoustic wave device suitably employed for a filter element, a duplexer, and so forth and carrying a plurality of surface acoustic wave elements respectively having different frequency pass bands, and a communication apparatus comprising the surface acoustic wave device. The communication apparatus is employed for a mobile communication apparatus such as a cellular phone, for example.

2. Description of Related Art

In a communication apparatus such as a cellular phone, a surface acoustic wave device using a surface acoustic wave element comprising an IDT (Inter Digital Transducer) electrode as a duplexer for separating a transmission signal and a receiving signal. The surface acoustic wave device is a small in size, has steep filter element characteristics, and has superior properties such as superior mass productivity.

Particularly in recent years, a small-sized surface acoustic wave device having a transmitting filter element and a receiving filter element integrated with each other is required in the surface acoustic wave device in order to make the communication apparatus small in size and lightweight. Although it goes without saying that low insertion loss is required as the filter element, a larger attenuation is required for out-of-band attenuation characteristics.

If the respective out-of-band attenuation characteristics of the transmitting filter element and the receiving filter element are degraded, an unnecessary radio signal is transmitted or received, thereby causing the possibilities that the quality of the received radio signal is degraded, and there arise problems such as interference with another radio communication apparatus.

The out-of-band attenuation characteristics of the conventional surface acoustic wave device cannot sufficiently cope with the foregoing requirements. A further improvement is desired.

The present invention has been devised in view of the foregoing desires, and has for its object to provide a surface acoustic wave device that comprises a high-frequency side filter element and a low-frequency side filter element, is superior in out-of-band attenuation characteristics of the filter elements, can be miniaturized, and is high in reliability.

SUMMARY OF THE INVENTION

A surface acoustic wave device according to the present invention comprise a first filter element formed on one main surface of a piezoelectric substrate, and comprising first input/output electrodes, a first ground electrode, and a first IDT electrode; a second filter element formed on the same surface of the piezoelectric substrate, comprising second input/output electrodes, a second ground electrode, and a second IDT electrode, and having a different frequency band from the first filter element; and a circuit board for mounting the surface of the piezoelectric substrate, the first ground electrode and the second ground electrode being electrically separated from each other on the surface of the piezoelectric substrate, a first grounding conductor terminal connected to the first ground electrode and a second grounding conductor terminal connected to the second ground electrode being separated from each other on a surface, on which the piezoelectric substrate is mounted, of the circuit board, a third ground electrode being provided on a surface on the side opposite to the surface, on which the piezoelectric substrate is mounted, of the circuit board or any inner layer surface of the circuit board, and first and second via conductors respectively connected to the first grounding conductor terminal and the second grounding conductor terminal and penetrating the circuit board down to the position of the third ground electrode.

According to this configuration, the two filter elements can be formed on the same piezoelectric substrate, thereby making it possible to make the surface acoustic wave device smaller in size and make a mounting area on the circuit board smaller, as compared with those in a case where they are respectively formed on separate piezoelectric substrates.

The out-of-band attenuation characteristics of the first filter element and the second filter element can be respectively reduced to desired values by providing the first and second via conductors for grounding the filter elements. Therefore, the surface acoustic wave device can be made high in reliability.

In the above-mentioned configuration, the surface acoustic wave device according to the present invention is characterized in that the pass band of the first filter element is lower than the pass band of the second filter element, and a series inductance of the first ground electrode, the first grounding conductor terminal, and the first via conductor is higher than a series inductance of the second ground electrode, the second grounding conductor terminal, and the second via conductor.

Each of the first filter element and the second filter element comprises a series IDT electrode connected between the input/output electrodes and a parallel IDT electrode connected between a signal line and the ground.

An effect produced by the configuration will be discussed.

FIG. 1 is a diagram showing an equivalent circuit of the IDT electrode. The impedance of the IDT electrode is represented by a complex Z1.

The series inductance of the first ground electrode, the first grounding conductor terminal, and the first via conductor is represented by Lg1, and the series inductance of the second ground electrode, the second grounding conductor terminal, and the second via conductor is represented by Lg2. Lg1 and Lg2 are generically referred to as "Lg".

FIG. 2 illustrates a circuit obtained by connecting the series inductance Lg in series with the circuit shown in FIG. 1. The impedance of the circuit shown in FIG. 2 is represented by the sum of Z1 and Lg, and is denoted by "Z". Let X be a reactance component of Z, and let R be a resistance component.

FIG. 3 is a graph using the reactance X to enter its vertical axis and using a frequency to enter its horizontal axis. The parameter of each of curves in the graph is the value of Lg.

The reactance X has a resonance point at a certain frequency fr0, and has an anti-resonance point at a frequency fa0 higher than the frequency fr0.

As can be seen from the graph, the larger the value of Lg is, the lower both the resonance frequency fr0 and the anti-resonance frequency fa0 become because the curve is raised upward.

FIG. 4 shows a graph using the absolute value |Z| of each of the respective impedances of the parallel IDT and the series IDT electrode in the first filter element and the parallel IDT electrode and the series IDT electrode in the second filter element to enter its vertical axis and a graph using the attenuation of each of the first filter element and the second filter element to enter its vertical axis. A common frequency is used to enter the horizontal axis of the graph.

As can be seen from the combined graphs, assuming that the impedance of the parallel IDT electrode in the first filter element is reduced in the vicinity of the anti-resonance frequency, as indicated by an arrow b, the attenuation on the high-frequency side outside the pass band of the first filter element can be increased (see an arrow d). On the other hand, assuming that the impedance of the parallel IDT electrode in the second filter element is reduced in the vicinity of the resonance frequency, as indicated by an arrow a, the attenuation on the low-frequency side outside the pass band of the second filter element can be increased (see an arrow c).

It is found that the series inductance $Lg1$ of the first filter element may be increased, as indicated by an arrow e in FIG. 3, in order to reduce the impedance of the parallel IDT electrode in the first filter element in the vicinity of the anti-resonance frequency, while the series inductance $Lg2$ of the second filter element may be reduced, as indicated by an arrow f shown in FIG. 3, in order to reduce the impedance of the parallel IDT electrode in the second filter element in the vicinity of the resonance frequency.

When a parasitic inductance produced at the grounding conductor terminal in the second filter element is thus reduced, the impedance Z in a band overlapped with the frequency band of the first filter element can be reduced with respect to the parallel IDT electrode in the second filter element.

As a result, it is possible to effectively prevent a signal passing through the band overlapped with the frequency band and to improve the out-of-band attenuation characteristics on the low-frequency side of the second filter element.

When a parasitic inductance produced at the grounding conductor terminal in the first filter element is increased, the impedance Z in a band overlapped with the frequency band of the second filter element can be decreased with respect to the parallel IDT electrode in the first filter element.

As a result, it is possible to effectively prevent a signal passing through the band overlapped with the frequency band and to improve the out-of-band attenuation characteristics on the high-frequency side of the first filter element.

In order to realize the above-mentioned decrease and increase in the parasitic inductance, it is considered that the area on the piezoelectric substrate of the first ground electrode is made smaller than the area on the piezoelectric substrate of the second ground electrode, the number of the first via conductors is made smaller than the number of the second via conductors, the first via conductor is formed in a crank shape, the second via conductor is formed in a liner shape, and the cross-sectional area of the first via conductor is made smaller than the cross-sectional area of the second via conductor.

In the surface acoustic wave device having the above-mentioned configuration, if the pass band of the receiving filter element is higher than the pass band of the transmitting filter element, the parasitic inductance produced at the grounding conductor terminal in the receiving filter element is reduced, and the parasitic inductance produced at the grounding conductor terminal in the transmitting filter element is increased, thereby making it possible to achieve improvements in the out-of-band attenuation characteristics, which are their respective objectives, and to obtain good communication quality in a case where it is used for a duplexer in the communication apparatus.

In each of the above-mentioned configurations, a surface acoustic wave device according to the present invention has a configuration in which an annular electrode surrounding the first and second filter elements is formed on the surface, having the first and second filter elements formed thereon, of the piezoelectric substrate, and an annular conductor connected to the annular electrode is formed on the surface, on which the piezoelectric substrate is mounted, of the circuit board. In this configuration, the surface acoustic wave element can be hermetically sealed and protected from outside air by the piezoelectric substrate, the circuit board, the annular electrode, and the annular conductor, which allows the surface acoustic wave element to be stably operated for a long time period. Therefore, the surface acoustic wave device can be made high in reliability.

The annular conductor may surround each of the filter elements. In this case, the annular electrodes respectively function as electromagnetic shields for the filter elements, so that electromagnetic coupling of the filter elements can be eliminated, and interference between the filter elements can be restrained.

The surface acoustic wave device according to the present invention employs a configuration in which the second ground electrode in the second filter element is connected to the annular electrode, and the annular conductor serving as the second grounding conductor terminal is connected to a third ground electrode by the plurality of second via conductors.

This configuration utilizes the annular electrode and the annular conductor in order to reduce the inductance of the ground electrode.

The surface acoustic wave device according to the present invention employs a configuration in which the second grounding conductor terminal is connected to the annular conductor, and the annular conductor is connected to the third ground electrode by a plurality of third via conductors.

This configuration utilizes the annular conductor in order to reduce the inductance of the grounding conductor terminal.

According to the configurations, the parasitic inductance can be reduced without newly manufacturing a ground electrode or a grounding conductor terminal having a large area in the second filter element. Therefore, the surface acoustic wave device according to the present invention can be made smaller in size.

A communication apparatus according to the present invention comprises the above-mentioned surface acoustic wave device, and a receiving circuit and/or a transmission circuit each using the surface acoustic wave device as a circuit element.

The communication apparatus can be significantly miniaturized by eliminating the necessity of a large-sized dielectric filter element as in the conventional example. Therefore, the communication apparatus can be made small in size and superior in communication quality.

An unnecessary out-of-band signal can be sufficiently removed by using the high-frequency side filter element having good out-of-band attenuation characteristics for the receiving filter element, for example, thereby allowing the quality of a receiving signal to be improved. Further, a communication signal superior in quality can be transmitted without transmitting an unnecessary out-of-band signal by using the low-frequency side filter element having good out-of-band attenuation characteristics for the transmitting filter element, for example. Therefore, the communication apparatus can be made superior in power resistance.

The foregoing and other objects, features, aspects and advantages of the present invention will become more apparent from the following detailed description of the present invention when taken in conjunction with the accompanying drawings.

DETAILED DESCRIPTION OF PREFERRED EMBODIMENTS

Figure 1:
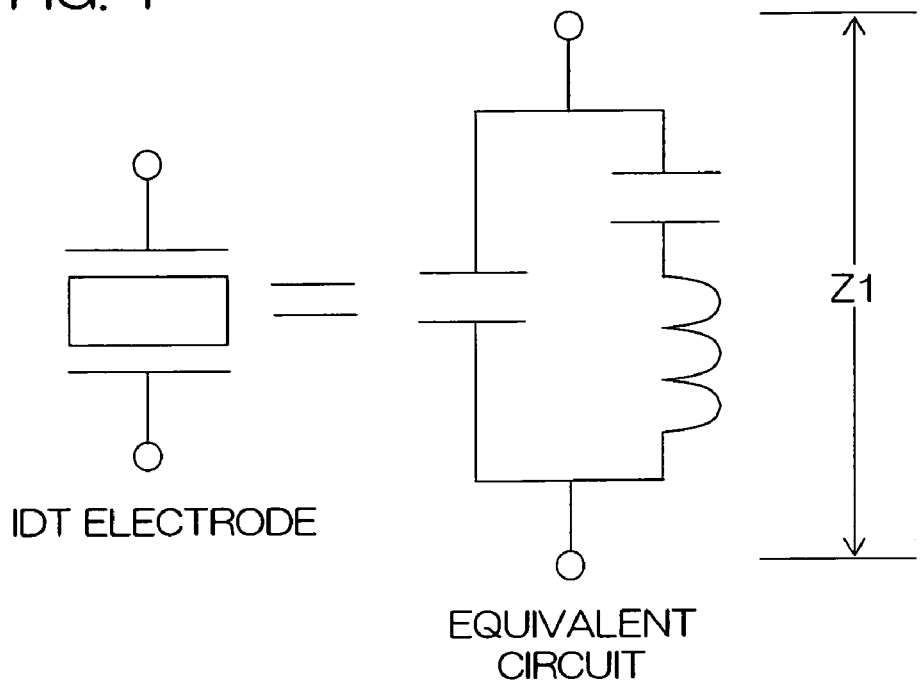
FIG. 1 is a diagram showing an equivalent circuit of an IDT electrode.
Figure 2:
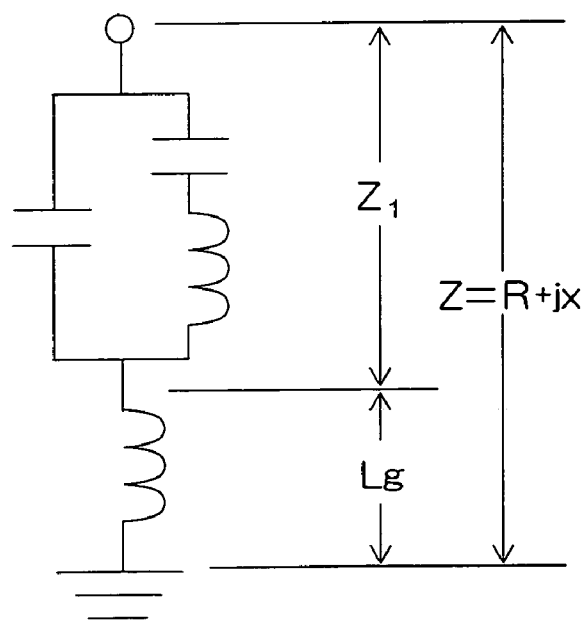
FIG. 2 illustrates a circuit having a series inductance Lg connected in series with an IDT electrode.
Figure 3:
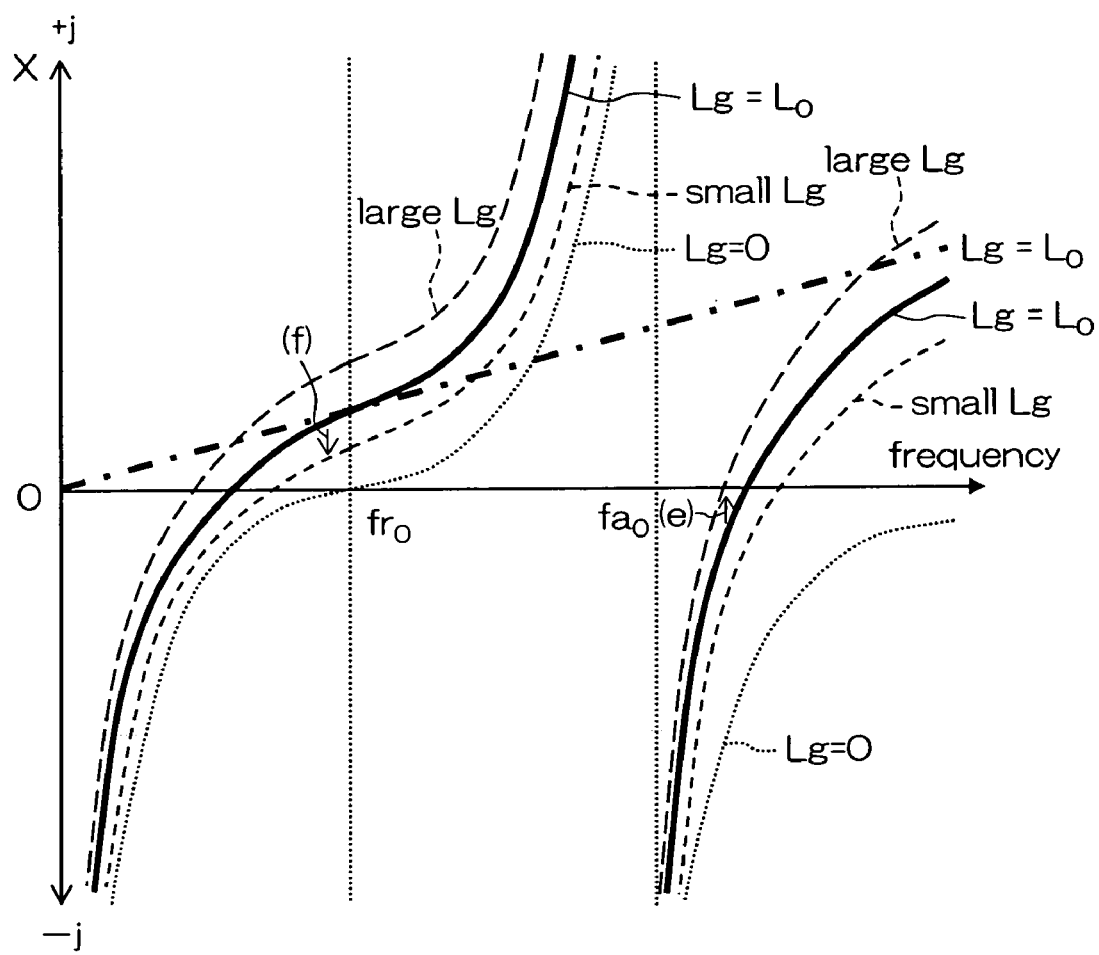
FIG. 3 is a graph using a reactance component X of the impedance Z of the circuit shown in FIG. 2 to enter its vertical axis and using a frequency to enter its horizontal axis.
Figure 4:
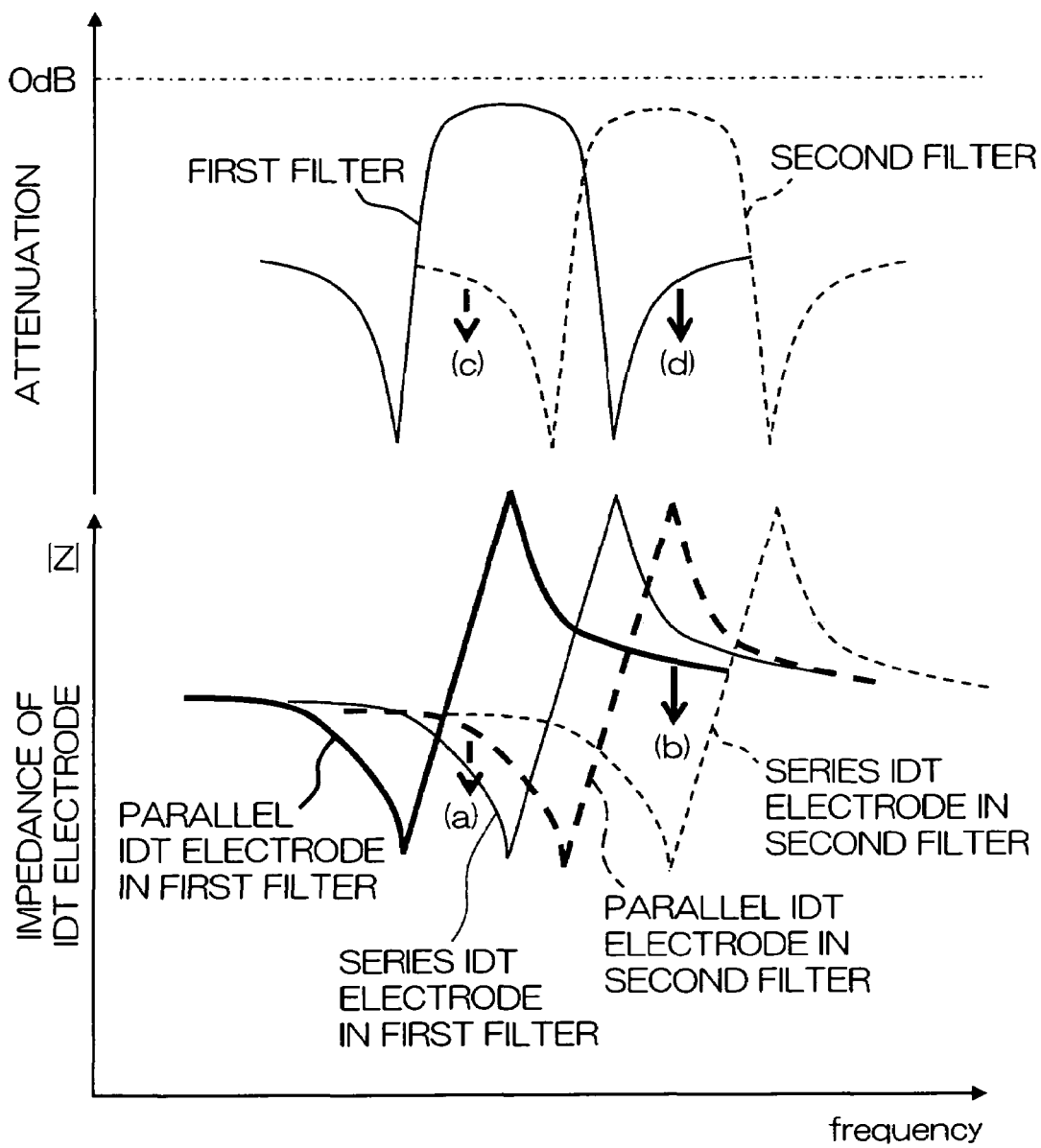
FIG. 4 is a graph using the absolute value of each of the impedances of a parallel IDT electrode and a series IDT electrode in a first filter element and a parallel IDT electrode and a series IDT electrode in a second filter element to enter its vertical axis and a graph using the pass attenuation characteristics of the first filter element and the second filter element to enter its vertical axis.
Figure 5:
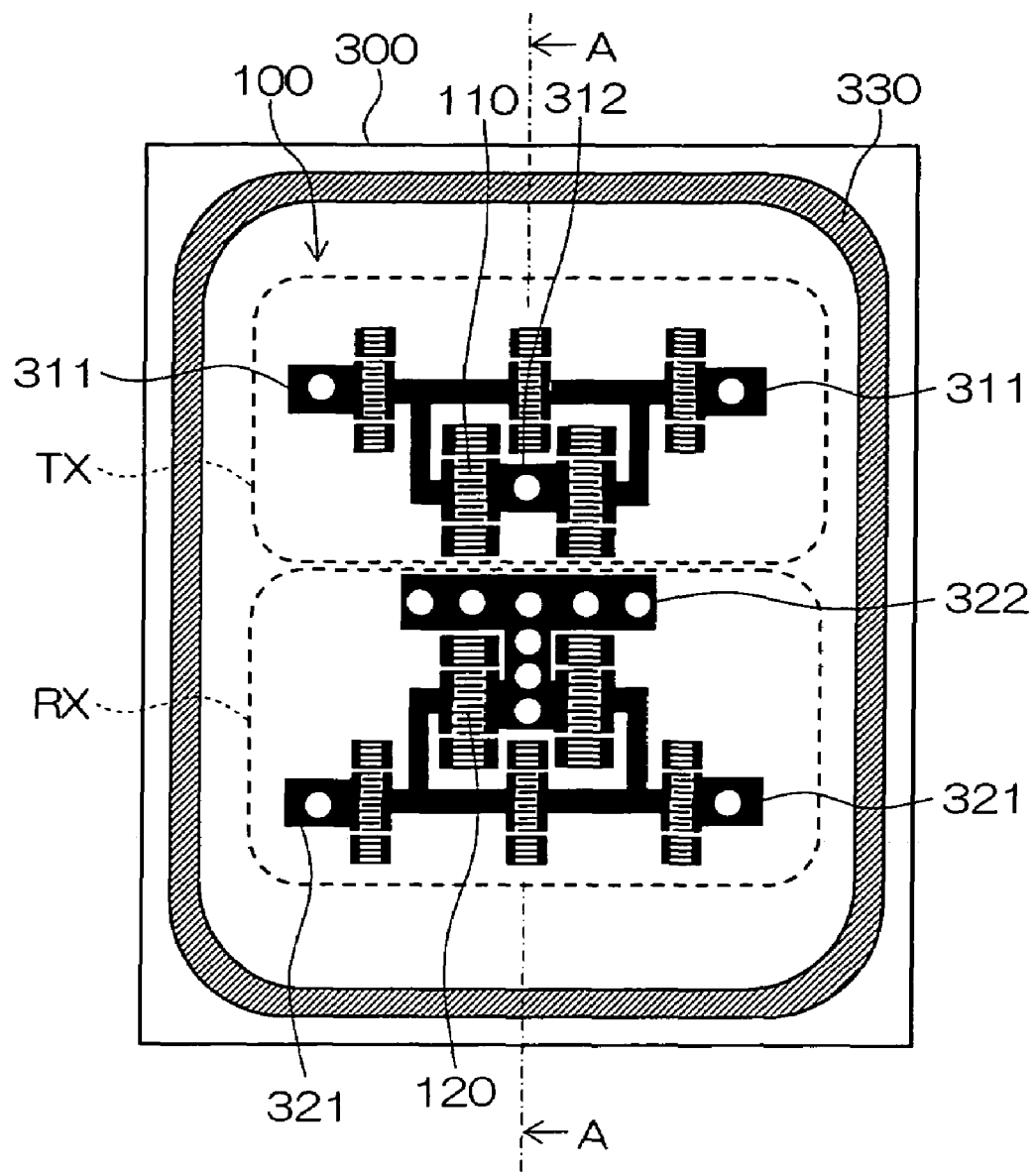
FIG. 5 is a plan view on the side of one main surface of a surface acoustic wave element 100, showing an embodiment of a surface acoustic wave device according to the present invention.
Figure 6:
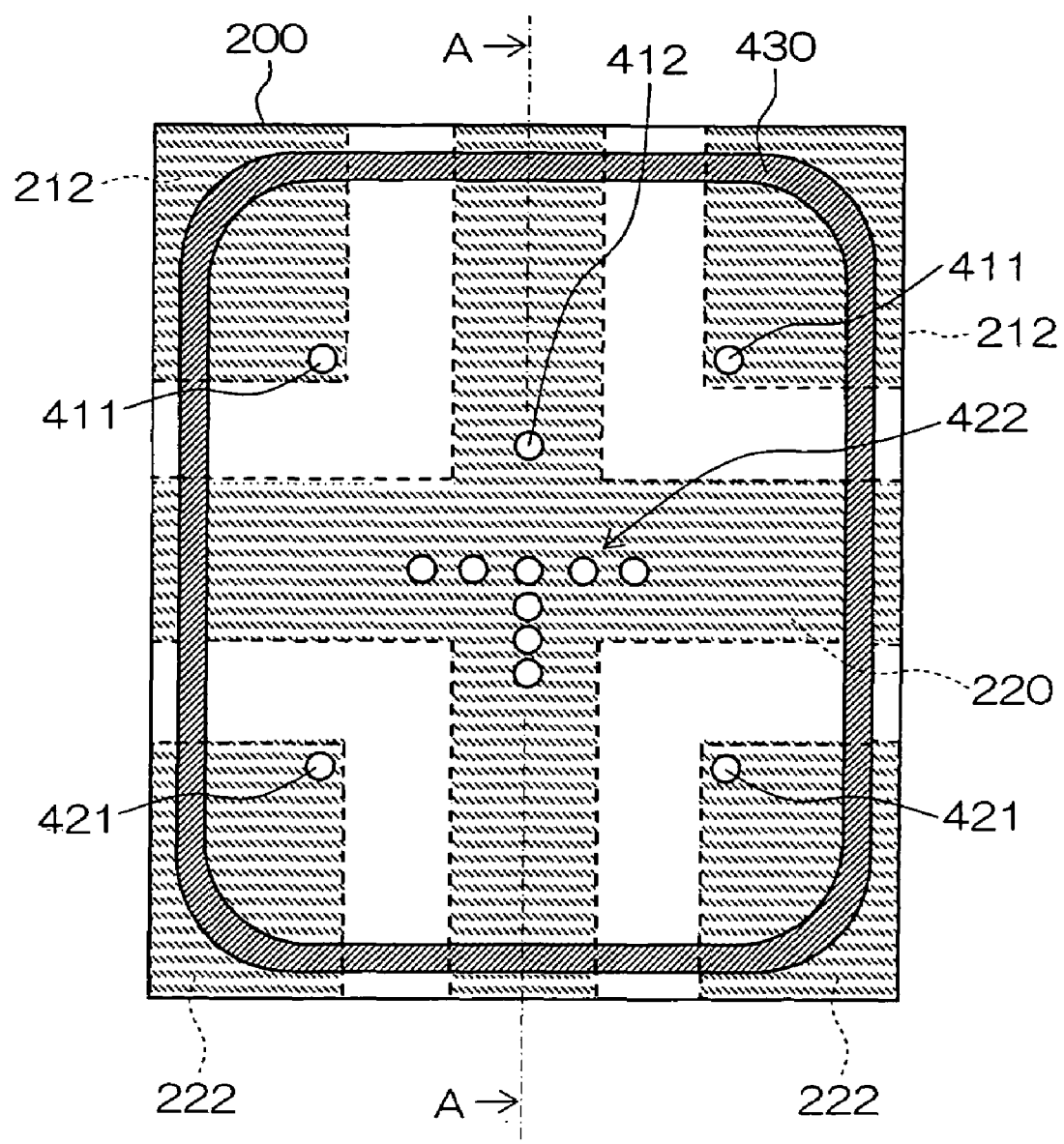
FIG. 6 is a plan view on an upper surface of a circuit board 200 on which the surface acoustic wave element 100 is mounted.

FIG. 5 is a plan view on the side of one main surface of a surface acoustic wave element 100, showing an embodiment of a surface acoustic wave device according to the present invention. FIG. 6 is a plan view on an upper surface of a circuit board 200 on which the surface acoustic wave element 100 is mounted.

The surface acoustic wave device 100 is formed on a piezoelectric substrate 300, and two types of filter elements that differ in pass bands are formed therein.

In the embodiment of the present invention, the filter element having the lower frequency band is used as a transmitting filter element TX, and the filter element having the higher frequency band is used as a receiving filter element RX.

In FIG. 5, on one main surface of the piezoelectric substrate 300, an IDT electrode 110, a ground electrode 312, and signal input/output electrodes 311 in the transmitting filter element TX are formed, and an IDT electrode 120, a ground electrode 322, and signal input/output electrodes 321 in the receiving filter element RX are formed.

The IDT electrode 110 in the transmitting filter element TX comprises a series IDT electrode connected between the signal input/output electrodes 311 and a parallel IDT electrode connected between a signal line and the ground.

The IDT electrode 120 in the receiving filter element RX comprises a series IDT electrode connected between the signal input/output electrodes 321 and a parallel IDT electrode connected between the signal line and the ground.

Furthermore, an annular electrode 330 having a substantially square shape is formed so as to surround the IDT electrode 110, the IDT electrode 120, and so forth on one main surface of the piezoelectric substrate 300.

The annular electrode 330 is thus provided along an outer edge of the piezoelectric substrate 300, which allows the IDT electrode 110, the IDT electrode 120, and so forth to be effectively arranged inside thereof utilizing a large area.

The annular electrode 330 may be formed so as to surround each of the transmitting filter element TX and the receiving filter element RX. When the annular electrode 330 is formed so as to surround each of the transmitting filter element TX and the receiving filter element RX, the annular electrode 330 functions as an electromagnetic shield for each of the filter elements, thereby making it possible to eliminate an electromagnetic coupling between the filter elements and to restrain interference between the filter elements.

FIG. 6 illustrates a circuit board 200 for mounting the piezoelectric substrate 300. Signal input/output conductor terminals 411 in the transmitting filter element TX, a grounding conductor terminal 412 in the transmitting filter element TX, signal input/output conductor terminals 421 in the receiving filter element RX, and a plurality of grounding conductor terminals 422 in the receiving filter element RX are respectively formed on an upper surface of the circuit board 200.

The signal input/output conductor terminal 411 corresponds to the signal input/output electrode 311 in the piezoelectric substrate 300, the grounding conductor terminal 412 corresponds to the ground electrode 312 in the piezoelectric substrate 300, the signal input/output conductor terminal 421 corresponds to the signal input/output electrode 321 in the piezoelectric substrate 300, and the grounding conductor terminal 422 corresponds to the ground electrode 322 in the piezoelectric substrate 300. An annular conductor 430 is formed so as to surround the terminals in correspondence with the annular electrode 330 in the piezoelectric substrate 300.

The annular conductor 430 is connected to a grounding conductor formed inside of or on a lower surface of the circuit board 200 through a via conductor, which is not illustrated. Consequently, heat generated by the IDT electrode 110 in the transmitting filter element TX can be diffused through the annular conductor 430 formed so as to surround the IDT electrode 110.

A reverse signal conductor 212 connecting with the signal input/output conductor terminal 411, a reverse signal conductor 222 connecting with the signal input/output conductor terminal 421, and a reverse grounding conductor terminal 220 connecting with the grounding conductor terminals 412 and 422 are respectively formed through via conductors, as indicated by broken hatching in FIG. 6, on a reverse surface of the circuit board 200.

The reverse grounding conductor terminal 220 is formed in a large area on the reverse surface of the circuit board 200, and serves as a ground terminal common to the grounding conductor terminal 412 in the transmitting filter element TX and the grounding conductor terminals 422 in the receiving filter element RX. The ground terminal functions as a third ground electrode.

In the above-mentioned surface acoustic wave device according to the present invention using the piezoelectric substrate 300 and the circuit board 200, the electrodes in the piezoelectric substrate 300 are respectively connected to the conductor terminals in the circuit board 200 via conductor bumps, and the annular electrode 330 is connected to the upper surface of the circuit board 200 in such a manner as to seal the annular conductor 430 formed in correspondence therewith in an annular shape using a brazing material such as a solder.

In such a way, the surface acoustic wave element 100 in which the transmitting filter element TX and the receiving filter element RX are formed on one main surface of the piezoelectric substrate 300 can be mounted with its one main surface opposed to the upper surface of the circuit board 200.

Hermeticity on the side of an operating surface of the piezoelectric substrate 300 can be kept by the above-mentioned annular sealing, which allows the surface acoustic wave element 100 to be stably operated without being affected by a protective material 500 or the like as well as allowing the operation to be stably performed for a long time period. Therefore, the surface acoustic wave device can be made high in reliability.

Furthermore, degradation by oxidation, for example, of each of the electrodes and the conductor terminals can be effectively prevented by sealing nitrogen gas serving as inert gas, for example, into a portion hermetically sealed in an annular shape by the annular electrode 330 and the annular conductor 430. Therefore, the surface acoustic wave device can be made higher in reliability.

It is preferable that the width of the annular electrode 330 is within a range from 0.05 mm to 0.15 mm, for example, in consideration of sealing properties by a brazing material such as a solder and positioning precision. If the width is smaller than 0.05 mm, it is difficult to satisfy sealing properties by a solder and reliability by mechanical stress. On the other hand, if the width is larger than necessary, it is difficult for the transmitting filter element TX and the receiving filter element RX to be effectively arranged using a large area inside of the annular electrode 330. Therefore, the width of the annular electrode 330 may be suitably set depending on properties and specifications required for the surface acoustic wave device.

Although in this example, one transmitting filter element TX and one receiving filter element RX are formed, and one annular electrode 330 is formed so as to surround the filter elements, a plurality of transmitting filter elements TX and a plurality of receiving filter elements RX may be provided inside of the annular electrode 330.

As described in the foregoing, one main surface of the piezoelectric substrate 300 may be divided into a plurality of areas, to form the transmitting filter element TX and the receiving filter element RX in each of the areas and form the annular electrode 330 so as to surround the filters. In such a case, mutual interference of a transmission signal or a receiving signal between surface acoustic wave devices respectively surrounded by the annular electrodes 330 can be significantly reduced.

The IDT electrode 110, the ground electrode 312, and the signal input/output electrodes 311 in the transmitting filter element TX and the IDT electrode 120, the ground electrode 322, and the signal input/output electrodes 321 in the receiving filter element RX are formed by forming a metal film such as an aluminum film using a vacuum film formation technique such as a sputtering method on one main surface of a piezoelectric substrate composed of lithium tantalate, for example, then forming a desired resist pattern using means such as photolithography, and etching away an unnecessary portion using the resist pattern as a mask.

A 36±3-degree Y-cut X-propagation lithium tantalate single crystal, a 42±3-degree Y-cut X-propagation lithium tantalate single crystal, a 64±3-degree Y-cut X-propagation lithium niobate single crystal, a 41±3-degree Y-cut X-propagation lithium niobate single crystal, and a 45±3-degree X-cut Z-propagation lithium tetraborate single crystal can be suitably used for the piezoelectric substrate 300 because their electromechanical coupling factors are high and their frequency temperature coefficients are low.

The thickness of the piezoelectric substrate 300 is suitably about 0.1 mm to 0.5 mm. If the thickness is less than 0.1 mm, the piezoelectric substrate 300 is liable to be broken. On the other hand, if the thickness exceeds 0.5 mm, the size of each of components is increased, thereby making it difficult to achieve miniaturization.

The IDT electrode 110 and the IDT electrode 120 can realize steep and low-loss filter element characteristics by constituting a ladder-type filter element having IDT electrodes connected in series and parallel in a ladder shape.

Figure 7:
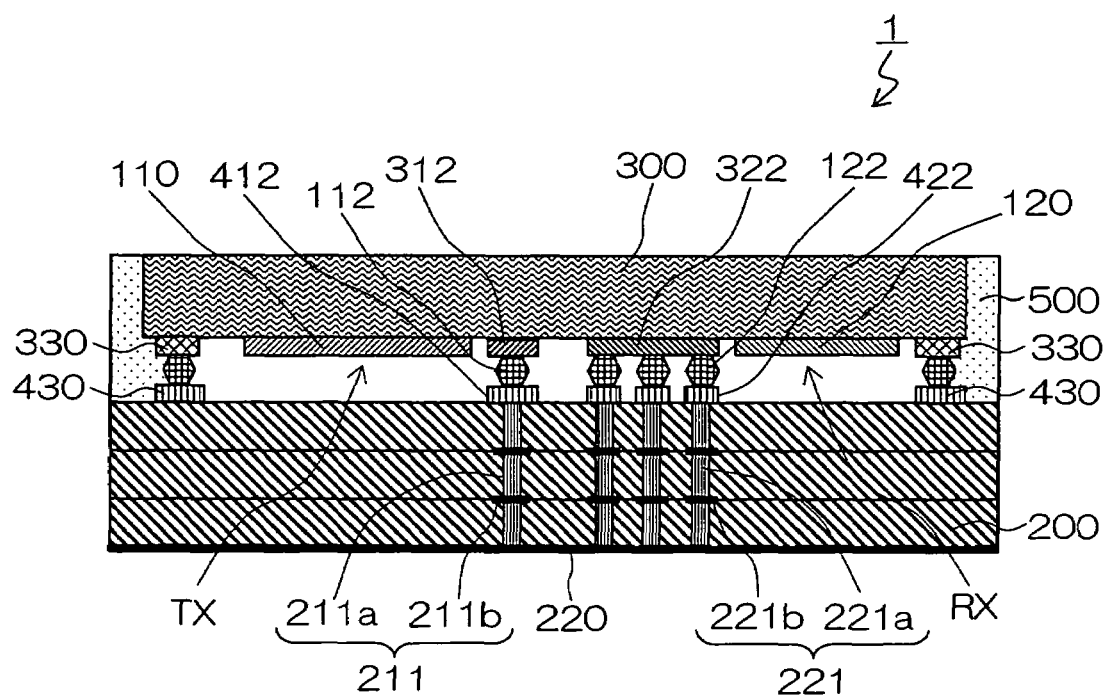
FIG. 7 is a cross-sectional view showing a surface acoustic wave device configured by joining a surface acoustic wave element on a piezoelectric substrate 300 shown in FIG. 5 and the circuit board 200 shown in FIG. 6.

FIG. 7 is a cross-sectional view, taking along a line A-A, of a surface acoustic wave device configured by joining the surface acoustic wave element on the piezoelectric substrate 300 shown in FIG. 5 and the circuit board 200 shown in FIG. 6, described above.

The circuit board 200 is produced by laminating a plurality of (three in this example) insulating layers.

Reference numeral 412 denotes the grounding conductor terminal in the transmitting filter element TX formed on the upper surface of the circuit board 200, and reference numeral 211 denotes a transmission-side via conductor formed inside of the circuit board 200.

The transmission-side via conductor 211 is formed by connecting a plurality of via conductors 211a in the vertical direction using conductor layers 211b formed among the insulating layers from the upper surface to the lower surface of the circuit board 200, and is connected to the grounding conductor terminal 412 on the upper surface of the circuit board 200, while being connected to the reverse grounding conductor terminal 220 on the reverse surface of the circuit board 200.

Reference numeral 422 denotes the grounding conductor terminal in the receiving filter element RX formed on the upper surface of the circuit board 200, and reference numeral 221 denotes a receiving-side via conductor formed in a linear shape from the upper surface to the reverse surface of the circuit board 200.

The receiving-side via conductor 221 is formed by connecting a plurality of via conductors 221a in the vertical direction using conductor layers 221b formed among the insulating layers from the upper surface to the lower surface of the circuit board 200, and is connected to the grounding conductor terminal 422 on the upper surface of the circuit board 200, while being connected to the reverse grounding conductor terminal 220 on the reverse surface of the circuit board 200.

Reference numerals 112 and 122 respectively denote conductor bumps, where reference numeral 112 denotes a transmitting filter element TX connecting bump, and reference numeral 122 denotes a receiving filter element RX connecting bump.

As shown in FIG. 7, one main surface of the piezoelectric substrate 300 is arranged opposite to the upper surface of the circuit board 200, the ground electrode 312 in the transmitting filter element TX and the grounding conductor terminal 412 in the circuit board 200 are connected to each other by the transmitting filter element TX connecting bump 112, and the ground electrode 322 in the receiving filter element RX and the grounding conductor terminal 422 in the circuit board 200 are electrically connected to each other by the receiving filter element RX connecting bump 122, so that the surface acoustic wave element 100 is mounted on the upper surface of the circuit board 200.

The signal input/output electrodes 311 in the transmitting filter element TX and signal input/output conductor terminals in the transmitting filter element TX formed on the upper surface of the circuit board 200 are similarly connected to each other by a conductor bump, and the signal input/output electrodes 321 in the receiving filter element RX and signal input/output conductor terminals in the receiving filter element RX formed on the upper surface of the circuit board 200 are also similarly connected to each other by a conductor bump, which is not illustrated in FIG. 7.

In such a way, the ground electrode 322 in the receiving filter element RX is connected to the reverse grounding conductor terminal 220 through the receiving filter element RX connecting bump 122 and the plurality of via conductors 221 formed in a linear shape from the upper surface to the lower surface of the circuit board 200, and the ground electrode 312 in the transmitting filter element TX is connected to the reverse grounding conductor terminal 220 through the transmitting filter element TX connecting bump 112 and the via conductor 211 formed from the upper surface to the lower surface of the circuit board 200.

Figure 17:
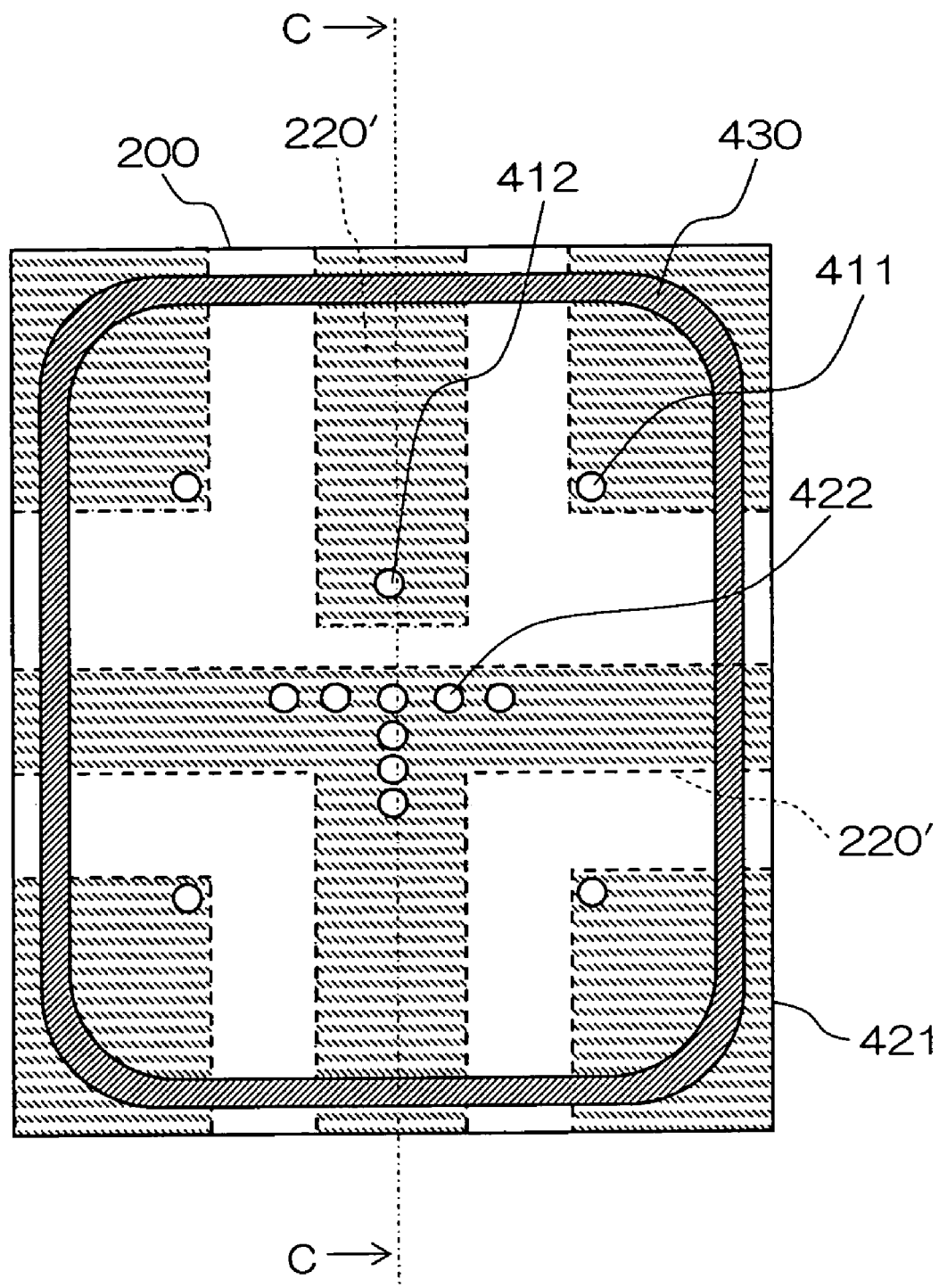
FIG. 17 is a plan view on an upper surface of the circuit board 200 on which the surface acoustic wave element 100 is mounted.
Figure 18:
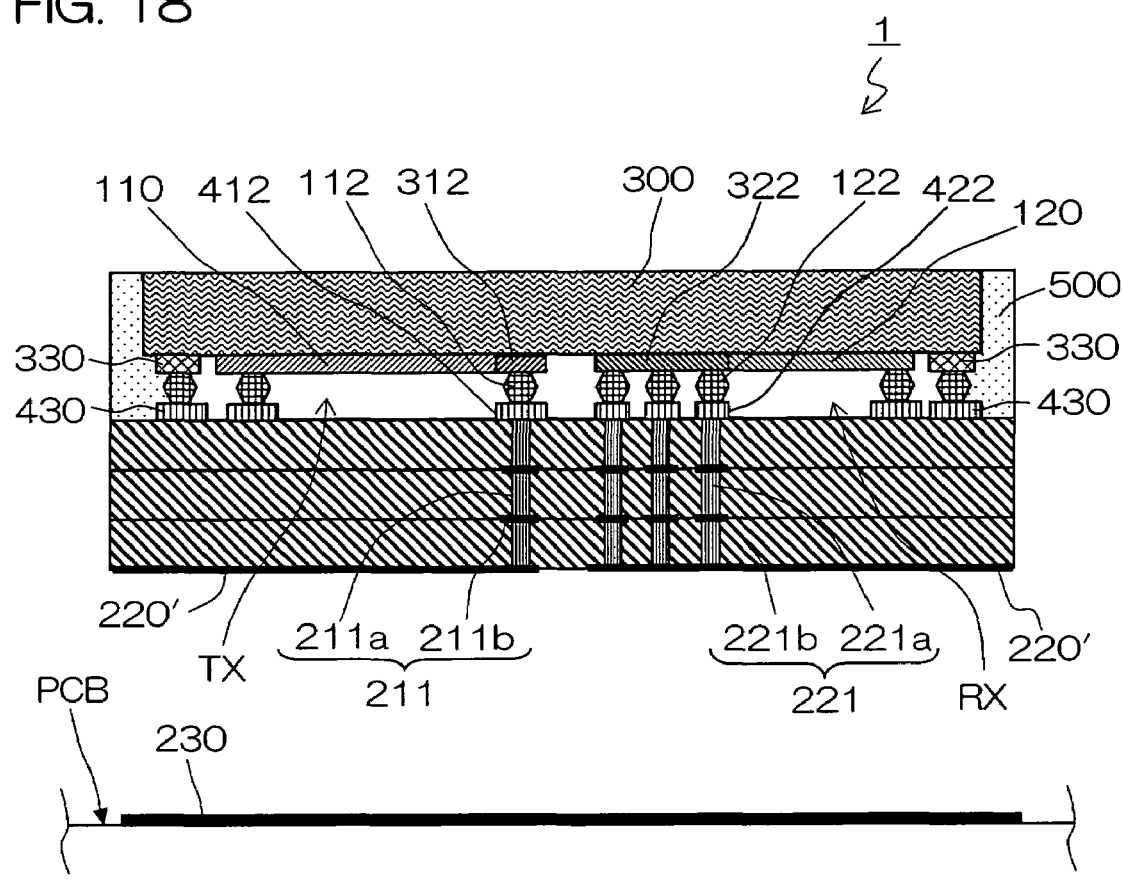
FIG. 18 is a cross-sectional view taken along a line C-C in FIG. 17.

Although in the example shown in FIGS. 6 and 7, the reverse grounding conductor terminal 220 for electrically connecting the ground electrode 322 in the receiving filter element RX and the ground electrode 312 in the transmitting filter element TX to each other on the reverse surface of the circuit board 200 is provided, a plurality of reverse grounding conductor terminals 220' may be provided without electrically connecting the ground electrode 322 in the receiving filter element RX and the ground electrode 312 in the transmitting filter element TX in the surface acoustic wave device 1, and connected to one another by a ground electrode 230 in a PCB (Printed Circuit Board) in a communication apparatus on which the surface acoustic wave device 1 is carried, as shown in FIGS. 17 and 18.

The via conductors 211a and 221a can be each formed so as to have a diameter of about 0.03 mm to 0.2 mm. When the diameter is made smaller than 0.03 mm, the via conductors 211a and 221a are shifted in position from the conductor layers 211b and 221b formed among the insulating layers in the circuit board 200, for example, which may, in some cases, cause reduction in connection reliability. When the diameter exceeds 0.2 mm, a difference in thermal expansion coefficient is increased between ceramics, for example, serving as a material for the insulating layer in the circuit board 200 and the via conductor composed of a metal, so that the insulating layer in the vicinity of the via conductor may be cracked, for example, which may, in some cases, cause reduction in connection reliability.

When the plurality of linear via conductors 221 are formed and are connected to the ground electrode 322 in the receiving filter element RX, the plurality of linear via conductors 221 are closely arranged about 0.02 mm to 0.2 mm apart, for example, so that a small inductance can be achieved in a small area.

Ceramics mainly composed of alumina, glass ceramics sinterable at low temperature, glass epoxy resin mainly composed of an organic material, or the like, for example, is used for the insulating layer in the circuit board 200. When ceramics or glass ceramics is used, the insulating layer is produced by molding a slurry obtained by homogenizing and kneading a metal oxide such as ceramics and an organic binder using an organic solvent or the like in a sheet shape to produce a green sheet, forming a desired wiring pattern or a via hole (via conductor) pattern for inner conductor connection on the green sheet, and then laminating and pressing the green sheets to integrally form the green sheets, followed by sintering.

A conductor pattern formed in each of the insulating layers is formed by subjecting a metal conductor such as Au, Cu, Ag, Ag—Pd, or W to a combination of screen printing or a film forming method such as evaporation or sputtering and etching, for example. A surface of each of the conductor patterns may be further plated with Ni, Au, or the like if required for good joining to the surface acoustic wave element 100.

The transmitting filter element TX connecting bump 112 and the receiving filter element RX connecting bump 122 are formed of a solder or a conductor material such as gold. When the conductor bumps are formed of a solder, they can be formed by applying a cream solder to the ground electrodes 312 and 322 and the signal input/output electrodes 311 and 321 by screen printing, for example, and then melting the solder. When the conductor bumps are formed of gold, they can be formed by wire bonding a gold wire, for example, to the ground electrodes 312 and 322 and the signal input/output electrodes 311 and 321 and cutting the gold wire to small lengths.

The grounding conductor terminals 412 and 422 and the signal input/output conductor terminals 411 and 421 in the circuit board 200 can be also respectively connected to the ground electrodes 312 and 322 and the signal input/output electrodes 311 and 321 by subjecting the grounding conductor terminals 412 and 422 and the signal input/output conductor terminals 411 and 421 to solder printing to form the conductor bumps. Alternatively, in the case of the connection using the conductor bumps, pressing may be performed while applying heat, ultrasonic waves, or the like. Therefore, the connection can be made reliablly and satisfactorily.

Furthermore, in FIG. 7, reference numeral 500 denotes a protective material for protecting the surface acoustic wave element 100 mounted on the circuit board 200. In this example, the protective material 500 detours to a side surface of the piezoelectric substrate 300 to hold the surface acoustic wave element 100. The protective material 500 is composed of epoxy resin, biphenyl resin, polyimide resin, or resin having filler such as alumina, aluminum nitride, silicon nitride incorporated therein as filler serving as a solid content. Alternatively, the protective material 500 may be a metal film composed of Au, Ag, Cu, Sn, Al, Pb, an alloy mainly composed of at least one of the metals, or the like. The piezoelectric substrate 300 can be protected from a mechanical shock, moisture, chemicals, etc. by the protective material 500, so that the surface acoustic wave device 1 can be made high in reliability. The protective material 500 may cover all surfaces other than a surface, on which the IDT electrode, and the like are formed, of the piezoelectric substrate 300 such that the piezoelectric substrate 300 is not exposed. This allows resistance to a mechanical shock to be further ensured.

Figure 8:
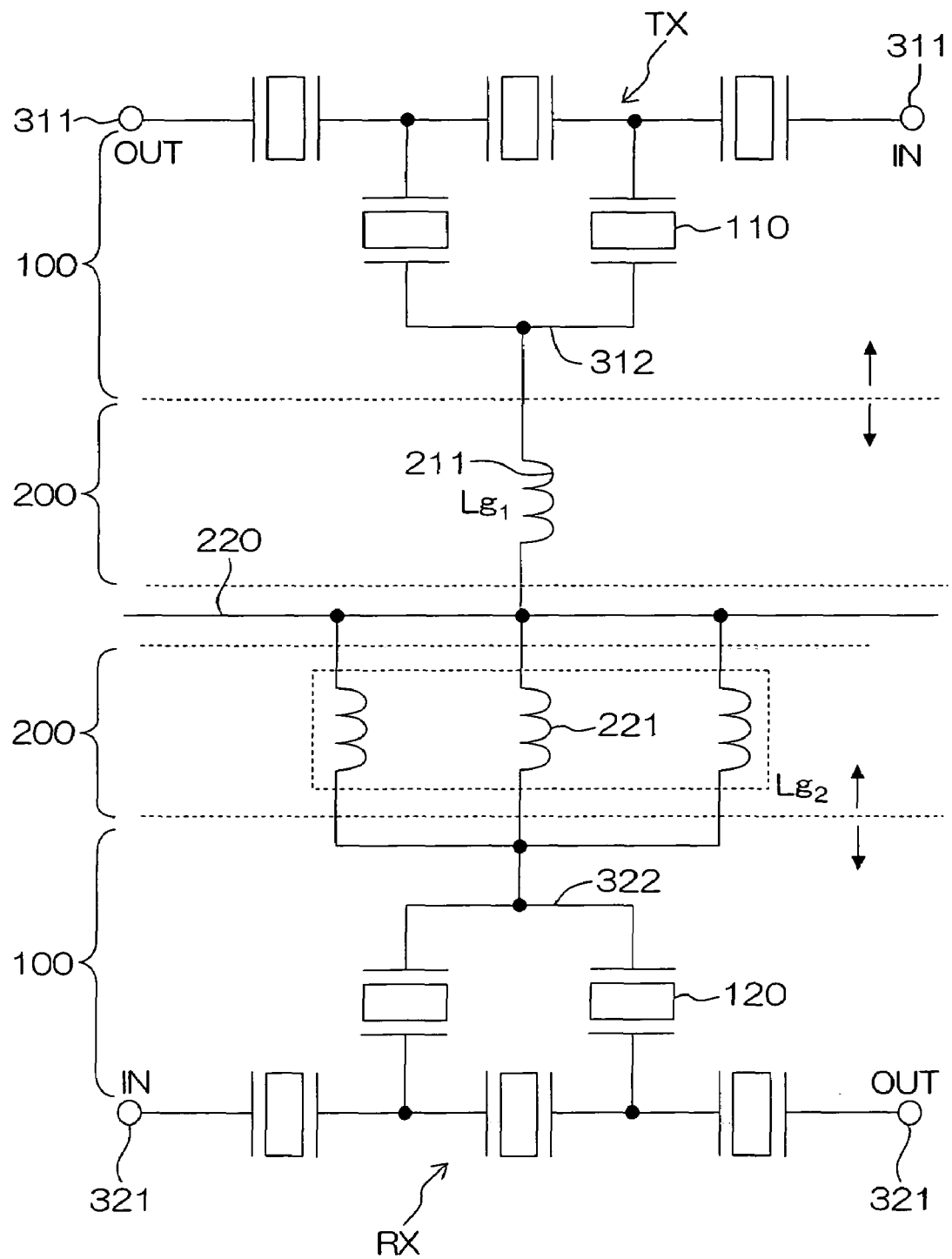
FIG. 8 is a circuit diagram of a surface acoustic wave device configured by joining a surface acoustic wave element on the piezoelectric substrate 300 shown in FIG. 5 and the circuit board 200 shown in FIG. 6.

FIG. 8 is a circuit diagram of a surface acoustic wave device configured by joining the surface acoustic wave element on the piezoelectric substrate 300 shown in FIG. 5 and the circuit board 200 shown in FIG. 6. The upper half of FIG. 8 indicates a circuit constituting the transmitting filter element TX, and the lower half thereof indicates a circuit constituting the receiving filter element RX. Both the circuits are grounded by the common reverse grounding conductor terminal 220.

In the surface acoustic wave device 1 according to the present invention, the ground electrode 322 in the receiving filter element RX is connected to the plurality of via conductors 221 provided from the upper surface to the lower surface of the circuit board 200, while the ground electrode 312 in the transmitting filter element TX is connected to the one via conductor 211 provided from the upper surface to the lower surface of the circuit board 200, so that a parasitic inductance produced at the grounding conductor terminal in the transmitting filter element TX can be increased.

This allows the impedance in a frequency band of a high-frequency side filter element, that is, a band overlapped with the receiving frequency band of the receiving filter element RX to be reduced with respect to the parallel IDT electrode in the transmitting filter element TX. Therefore, a signal passing through the band overlapped with the receiving frequency band can be effectively prevented. Consequently, the out-of-band attenuation characteristics on the high-frequency side of the transmitting filter element TX can be significantly improved.

In the surface acoustic wave device 1 according to the present invention, the ground electrode 322 in the receiving filter element RX is connected to the plurality of linear via conductors 221 formed in a linear shape from the upper surface to the lower surface of the circuit board 200, so that a parasitic inductance produced at the grounding conductor terminal in the receiving filter element RX can be reduced.

This allows the impedance in a frequency band of a low-frequency side filter element, that is, a band overlapped with the transmission frequency band of the transmitting filter element TX to be reduced with respect to the parallel IDT electrode in the receiving filter element RX. Therefore, a signal passing through the band overlapped with the transmission frequency band can be effectively prevented. Consequently, the out-of-band attenuation characteristics on the low-frequency side of the transmitting filter element RX can be satisfactorily improved.

In the above-mentioned embodiment, the number of grounding via conductors in the transmitting filter element TX is made smaller than the number of grounding via conductors in the receiving filter element RX (in the example shown in FIG. 5, the number of via conductors in the receiving filter element RX is eight, while the number of via conductors in the transmitting filter elements TX is one), to increase the parasitic inductance produced at the grounding conductor terminal in the transmitting filter element TX.

However, there is a method of curving the grounding via conductor in the transmitting filter element TX in a crank shape in addition to or in place of the method.

Figure 9:
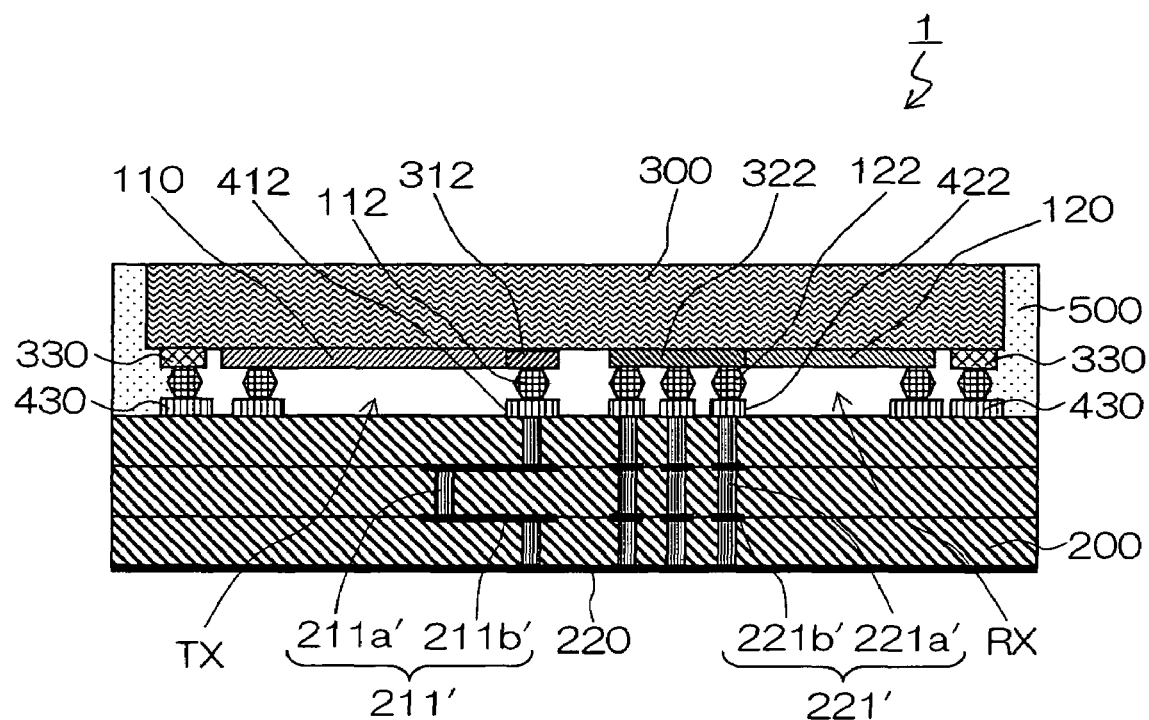
FIG. 9 is a cross-sectional view showing an example in which a grounding via conductor in a transmitting filter element TX is formed in a crank shape.

FIG. 9 illustrates an example in which the shape of the grounding via conductor in the transmitting filter element TX is changed.

Reference numeral 211' denotes a transmission-side via conductor formed inside of the circuit board 200. The via conductor 211' is formed by connecting a plurality of via conductors 211a' formed by shifting their positions in the vertical direction from the upper surface to the lower surface of the circuit board 200 by conductor layers 211b' formed among the insulating layers within the circuit board 200, and is connected to the grounding conductor terminal 412 on the upper surface of the circuit board 200.

Reference numeral 422 denotes the grounding conductor terminal in the receiving filter element RX formed on the upper surface of the circuit board 200, and reference numeral 221' denotes a plurality of linear via conductors formed in a linear shape from the upper surface to the lower surface of the circuit board 200.

Thus, the ground electrode 322 in the receiving filter element RX is connected to the plurality of linear via conductors 221' formed in a linear shape from the upper surface to the lower surface on the circuit board 200 through bumps 122, and the ground electrode 312 in the transmitting filter element TX is connected to the crank-shaped via conductor 211' formed by connecting the via conductors 211a' provided by shifting their positions in the vertical direction from the upper surface to the lower surface of the circuit board 200 by the conductor layers 211b' formed among the insulating layers within the circuit board 200 through a bump 112, thereby constituting a surface acoustic wave device 1 shown in FIG. 9.

The crank-shaped via conductor 211' is provided so that a parasitic inductance produced at the grounding conductor terminal 312 in the transmitting filter element TX can be increased, which allows the impedance in a band overlapped with the receiving frequency band of the receiving filter element RX to be reduced with respect to the parallel IDT electrode in the transmitting filter element TX. Therefore, a signal passing through the band overlapped with the receiving frequency band can be effectively prevented. Consequently, the out-of-band attenuation characteristics on the high-frequency side of the transmitting filter element TX can be significantly improved.

Furthermore, the plurality of linear via conductors 221' are provided from the upper surface to the lower surface of the circuit board 200 and are connected in parallel, so that an inductance value can be further reduced. Therefore, a parasitic inductance produced at the grounding conductor terminal in the receiving filter element RX can be further reduced. Consequently, the out-of-band attenuation characteristics of the receiving filter element RX can be significantly improved.

In the foregoing embodiment, the impedance is increased by forming the via conductor 211' in the transmitting filter element TX in a crank shape, while being reduced by increasing the number of linear via conductors 221' in the receiving filter element RX. However, the other methods include a method of changing the diameter of the grounding via conductor and a method of changing the length of the grounding via conductor.

Figure 10:
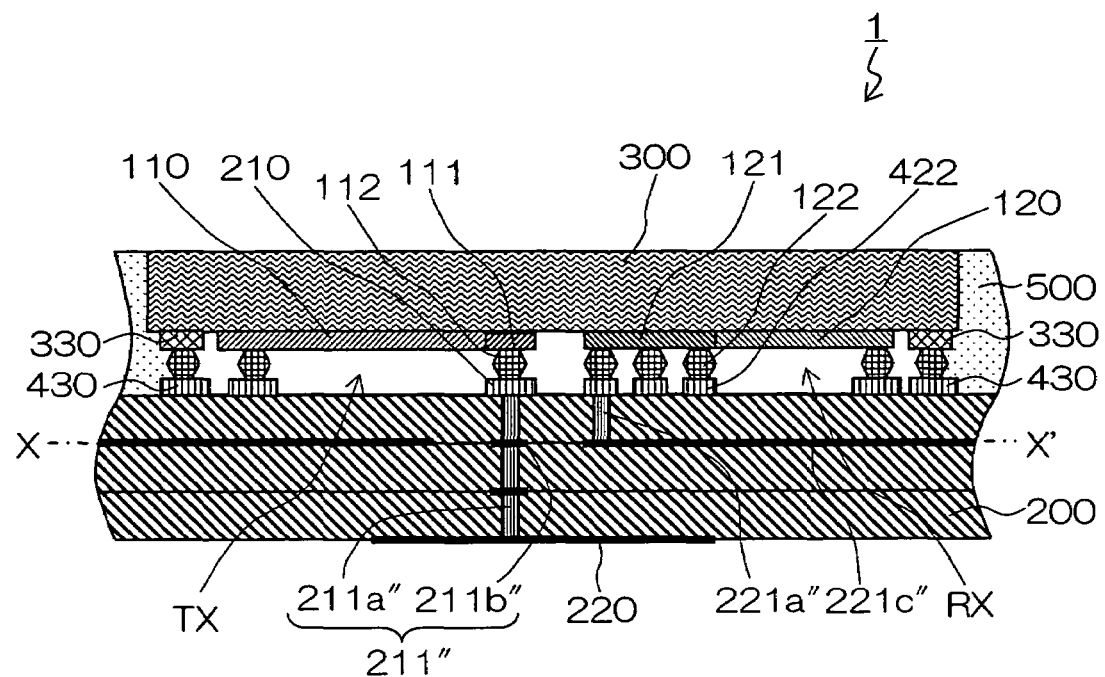
FIG. 10 is a cross-sectional view showing an example in which the length of a grounding via conductor in a receiving filter element RX is reduced.

FIG. 10 is a cross-sectional view showing an example in which the length of the grounding via conductor in the receiving filter element RX is reduced. It is assumed that the circuit board 200 is for a module on which elements other than the piezoelectric substrate 300 are also carried.

Reference numeral 211" denotes one transmission-side via conductor formed inside of the circuit board 200. The via conductor 211" has the same structure as that shown in FIG. 7.

Reference numeral 221a" denotes a short via conductor formed from the grounding conductor terminal in the receiving filter element RX formed on the upper surface of the circuit board 200 to an inner layer ground electrode 221c".

In this example, the solid inner layer ground electrode 221c" is produced on an inner surface of the multilayer circuit board 200, for example, an X-X' surface shown in FIG. 10, and the inner layer ground conductor 221c" is connected to any common ground potential (not shown).

The inner layer ground electrode 221c" must be provided with a hole at its portion through which the via conductor 211" passes so as not to come into contact with the via conductor 211" in the transmitting filter element TX.

The via conductor 221a" is thus connected to the inner layer ground electrode 221c", thereby making it possible to make the length thereof smaller than the thickness of the circuit board 200 and to make the inductance Lg of the via conductor 221a" smaller than the inductance of the via conductor 211" in the transmitting filter element TX.

It is also effective to make the diameter of the via conductor in the transmitting filter element TX relatively smaller than the diameter of the via conductor in the receiving filter element RX within an allowable range of the diameter of the via conductor, described above, which is not illustrated. Specifically, the diameter of the linear via conductor may be set to not more than 0.1 mm for the purpose of reducing the inductance of the via conductor.

Another embodiment of the surface acoustic wave device according to the present invention will be described.

Figure 14:
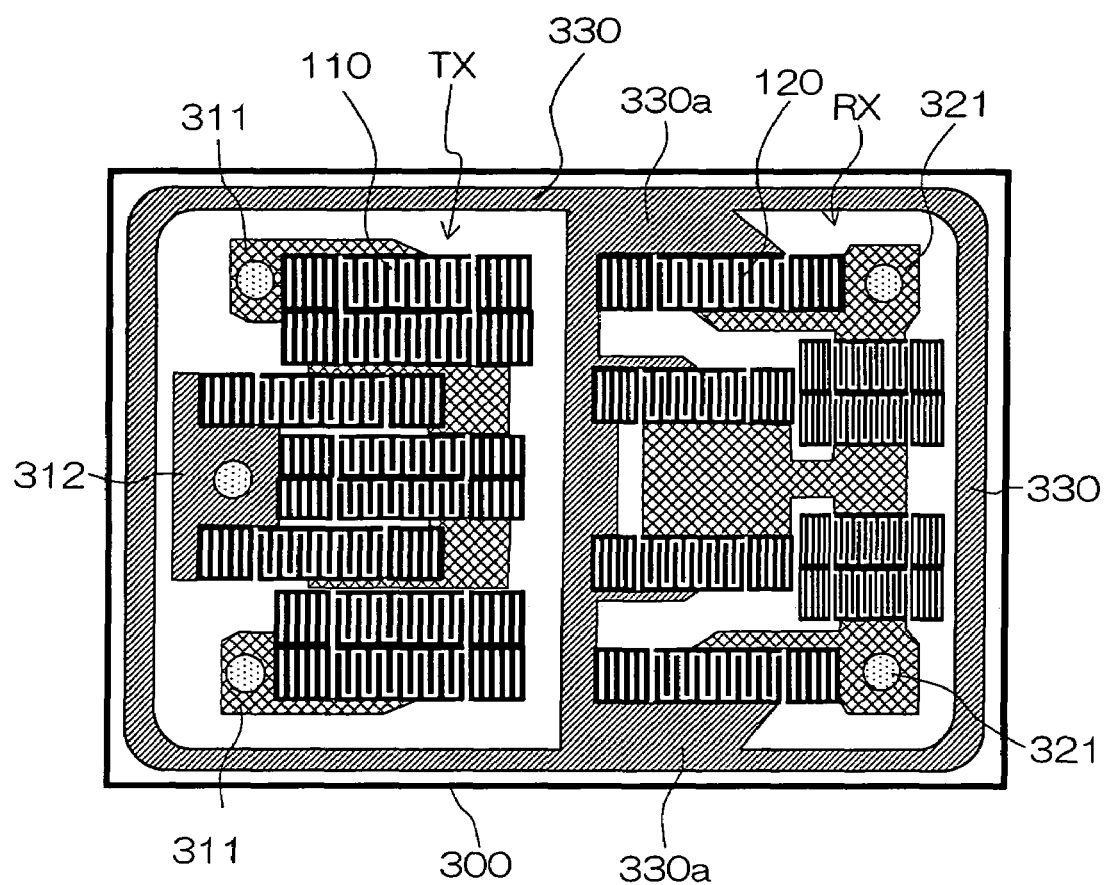
FIG. 14 is a plan view on the side of one main surface of a piezoelectric substrate 300, showing another embodiment of a surface acoustic wave device according to the present invention.
Figure 15:
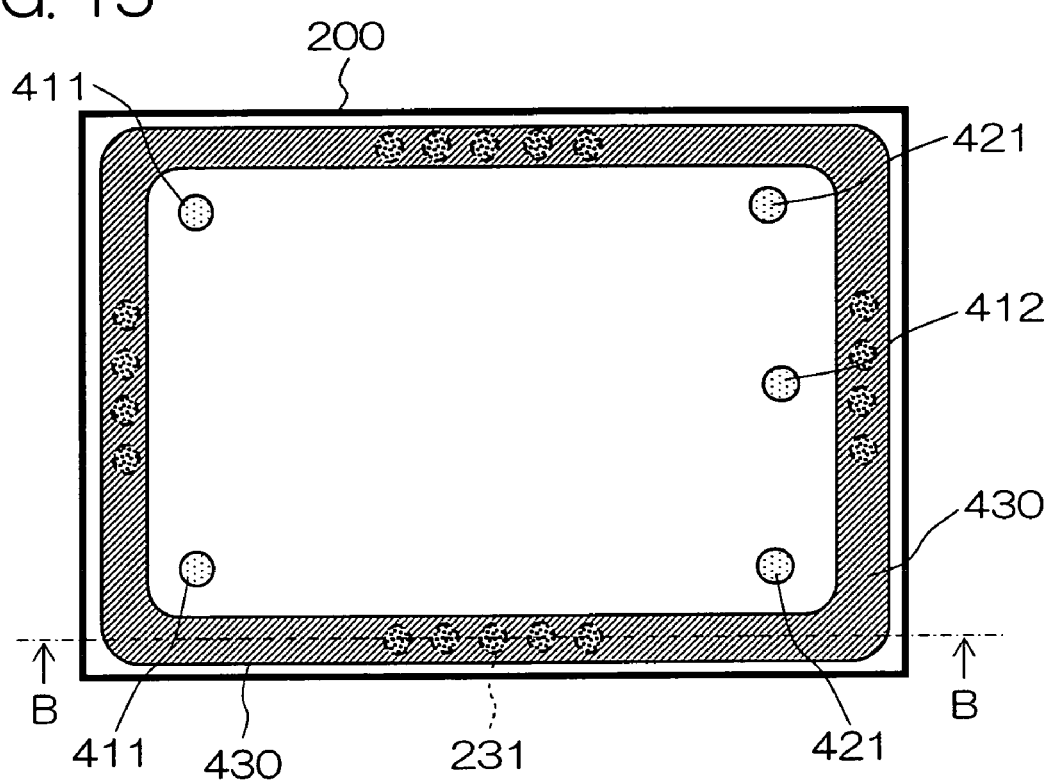
FIG. 15 is a plan view on an upper surface of a circuit board 200 on which a surface acoustic wave element 100 is mounted.
Figure 16:
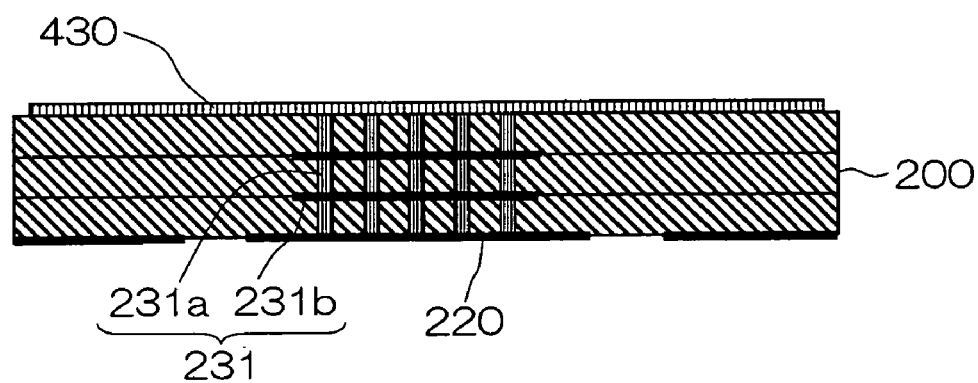
FIG. 16 is a cross-sectional view taken along a line B-B in FIG. 15.

FIG. 14 is a plan view showing one main surface of a surface acoustic wave element. FIG. 15 is a plan view showing an upper surface of a circuit board 200 on which the surface acoustic wave element is mounted. FIG. 16 is a cross-sectional view, taken along a line B-B, of the circuit board 200 shown in FIG. 15.

In this example, the same members as those shown in FIG. 5 to 7 are assigned the same reference numerals and hence, the overlapped description is omitted.

This configuration differs from the configuration shown in FIGS. 5 to 7 in that a ground electrode in a receiving filter element RX is formed as a conductor pattern 330a on a piezoelectric substrate 300, and the conductor pattern 330a is connected to an annular electrode 330. An annular conductor 430 formed on the upper surface of the circuit board 200 and connected to the annular electrode 330 is connected to a grounding conductor terminal 220 formed on a reverse surface of the circuit board 200 through a plurality of via conductors 231 provided on the four sides of the circuit board 200.

In the configuration, the area of the ground electrode 322 shown in FIG. 5 is ensured by utilizing the annular electrode 330.

By this configuration, the ground inductance Lg2 of the receiving filter element RX can be set to a low value utilizing a large area of the annular electrode 330.

This configuration allows a smaller-sized surface acoustic wave device to be realized. Further, the annular electrode 430 is grounded, so that interference from the exterior can be further reduced.

Figure 19:
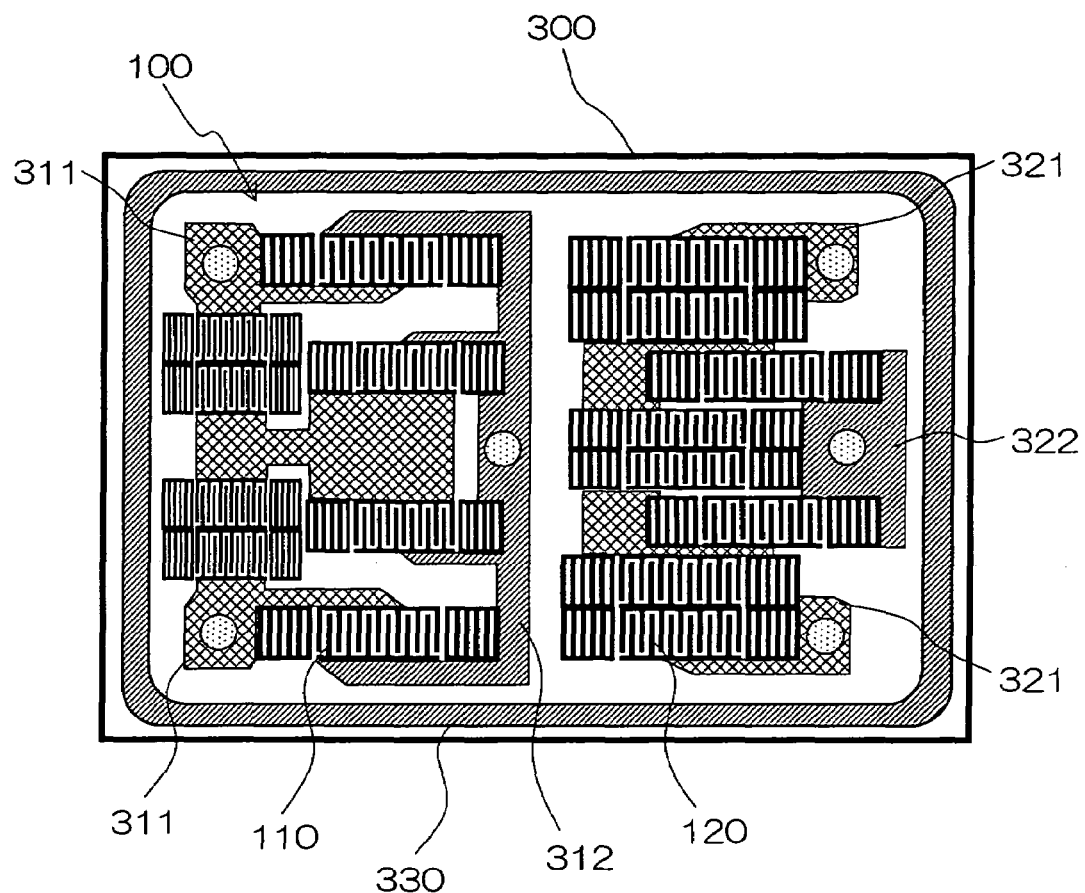
FIG. 19 is a plan view on the side of one main surface of a piezoelectric substrate 300, showing another embodiment of a surface acoustic wave device according to the present invention.
Figure 20:
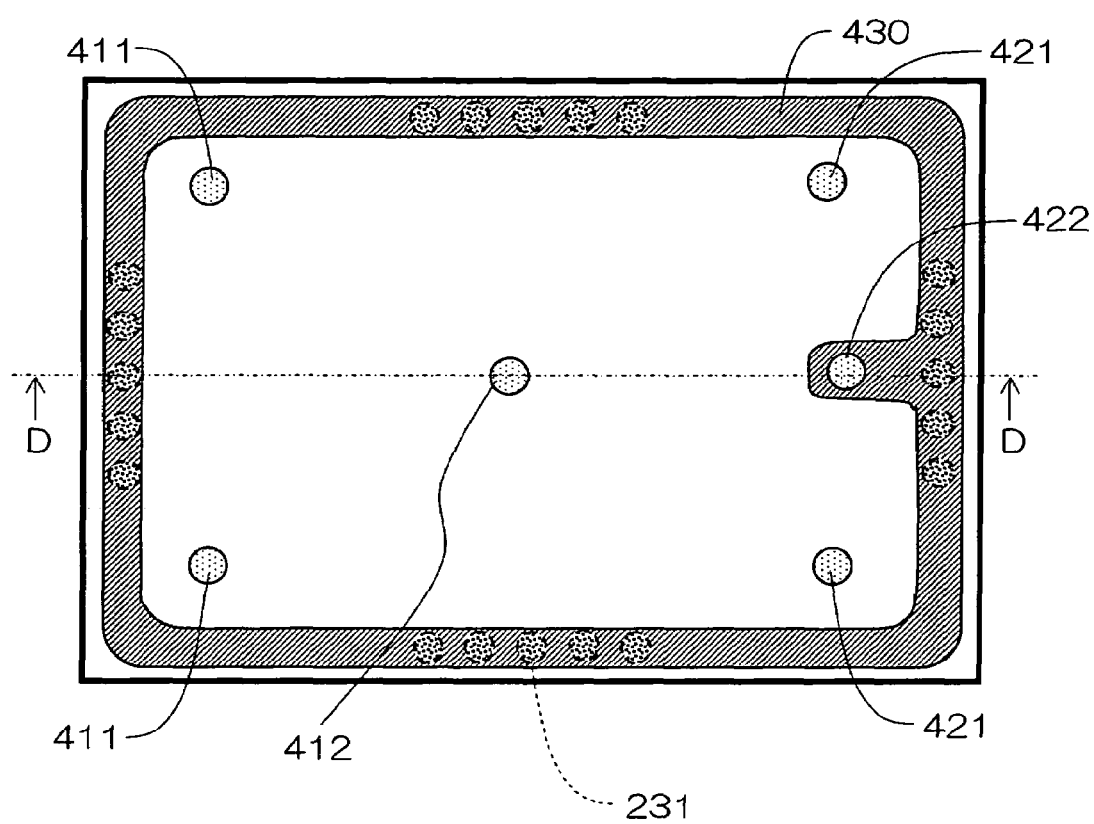
FIG. 20 is a plan view on an upper surface of a circuit board 200 on which a surface acoustic wave device is mounted.
Figure 21:
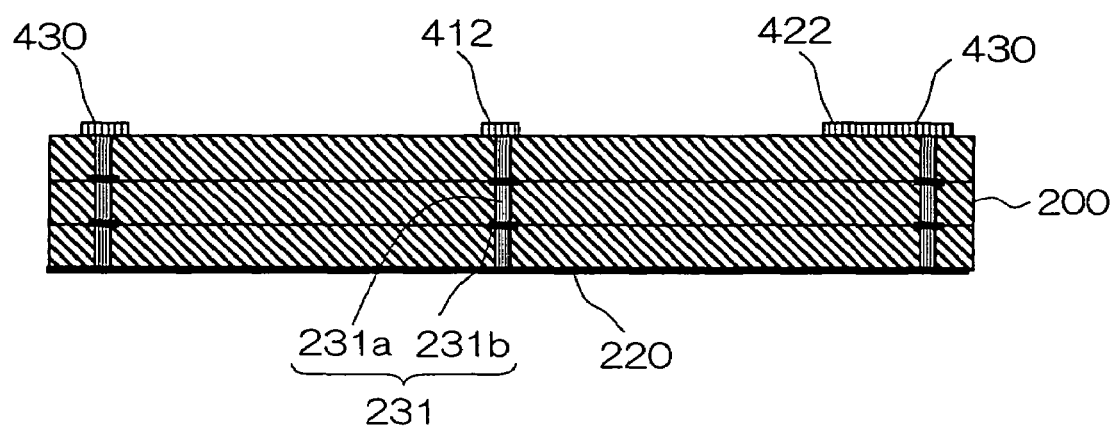
FIG. 21 is a cross-sectional view taken along a line D-D in FIG. 20.

In place of the configuration in which the conductor pattern 330a is connected to the annular electrode 330, a configuration in which the ground electrode 322 and the annular electrode 330 in the receiving filter element RX are separated from each other, as shown in FIG. 19, on the piezoelectric substrate 300, a grounding conductor terminal 422 connected to the ground electrode 322 in the receiving filter element RX is formed as a conductor pattern, as shown in FIG. 20, on the circuit board 200, and the conductor pattern is connected to the annular conductor 430 on the circuit board 200 may be employed. The annular conductor 430 is connected to a grounding conductor terminal 220 formed on the reverse surface of the circuit board 200 through a plurality of via conductors 231 provided on the four sides of the circuit board 200, as shown in FIG. 21.

In this configuration, the ground inductance Lg2 of the receiving filter element RX can be set to a low value utilizing a large area of the annular conductor 430. Consequently, the surface acoustic wave device can be made smaller in size.

The surface acoustic wave device according to the present invention having the foregoing configuration is suitably employed for a communication apparatus and particularly, a communication apparatus that handles multibands. Such a communication apparatus will be described using FIG. 11.

Figure 11:
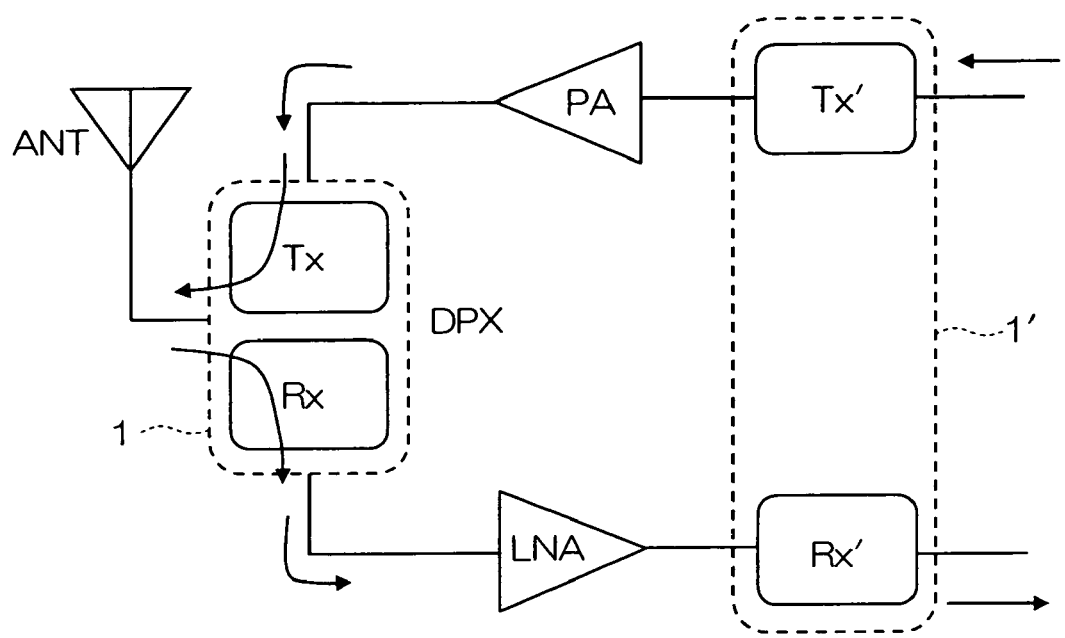
FIG. 11 is a block diagram showing a communication apparatus comprising an antenna, a duplexer DPX1 using the surface acoustic wave device according to the present invention, a transmission power amplifier PA, a receiving low-noise amplifier LNA, and an interstage surface acoustic wave device 1' using the surface acoustic wave device according to the present invention.

FIG. 11 is a block diagram showing a communication apparatus comprising an antenna, a transmission/receiving branching circuit (hereinafter referred to as a duplexer) DPX, for separating a transmission/receiving frequency band, to which the surface acoustic wave device 1 according to the present invention comprising the transmitting filter element TX and the receiving filter element RX is applied, a transmission power amplifier PA, a receiving low-noise amplifier LNA, and an interstage transmitting filter element TX', and an interstage receiving filter element RX'. The interstage transmitting filter element TX' and the interstage receiving filter element RX' may be produced on the same piezoelectric substrate to constitute a surface acoustic wave device 1' according to the present invention.

In the communication apparatus, a transmission signal outputted from a transmission circuit (not shown) is mixed with a carrier frequency by a mixer (not shown), an unnecessary signal of the transmission signal is attenuated by the transmitting band-pass filter element TX', and the transmission signal is then amplified by the transmission power amplifier PA and is transmitted from the antenna through the duplexer DPX.

In the duplexer DPX, the radio signal pass band of the receiving filter element RX is made higher than the radio signal pass band of the transmitting filter element TX.

A receiving signal received by the antenna is amplified by the receiving low noise amplifier LNA after passing through the duplexer DPX, an unnecessary signal of the receiving signal is then attenuated by the receiving band-pass filter element RX', and the receiving signal is separated from the carrier frequency by the mixer (not shown) and is transmitted to a receiving circuit and extracted.

By the above-mentioned configuration of the surface acoustic wave device according to the present invention, the parasitic inductance produced at the grounding conductor terminal in the receiving filter element RX is reduced, and the parasitic inductance produced at the grounding conductor terminal in the transmitting filter element TX is increased, thereby making it possible to achieve improvements in the out-of-band attenuation characteristics, which are their respective objectives, and to obtain a good transmission/receiving separation performance as a radio communication apparatus.

In the communication apparatus according to the present invention, it is preferable that in order to sufficiently exhibit the effect produced by the surface acoustic wave device according to the present invention, both the transmitting filter element TX and the receiving filter element RX are carried on the surface acoustic wave device 1, as in the configuration already described. Consequently, both the unnecessary signals of the transmission signal and the receiving signal can be sufficiently reduced, thereby allowing the communication quality to be improved as well as allowing the transmitting filter element TX and the receiving filter element RX to be integrated to constitute a small-sized filter element. Therefore, the communication apparatus can be made small in size and high in quality.

Although in the surface acoustic wave device and the communication apparatus according to the present invention, description was made using as an example a case where the low-frequency side filter element constituted by the low-frequency side IDT electrodes is used as the transmitting filter element TX, and the high-frequency side filter element constituted by the high-frequency side IDT electrodes is used as the receiving filter element RX, the low-frequency side filter element constituted by the low-frequency side IDT electrodes may be used as the receiving filter element RX, and the high-frequency side filter element constituted by the high-frequency side IDT electrode may be used as the transmitting filter element TX. In this case, the surface acoustic wave device and the communication apparatus also produce the same function and effect as described above.

The following are examples of the transmission frequency band and the receiving frequency band that are applied to the surface acoustic wave device and the communication apparatus according to the present invention. In the case of a CDMA (Code Division Multiple Access) system in the U.S., a low-frequency side filter element and a high-frequency side filter element are respectively set to a transmitting filter element TX and a receiving filter element RX by taking the transmission frequency band as 824 MHz to 849 MHz and taking the receiving frequency band as 869 MHz to 894 MHz in the Cellular band. This setting allows for application as a duplexer used for the communication system. Further, a low-frequency side filter element and a high-frequency side filter element may be respectively set to a transmitting filter element TX and a receiving filter element RX by taking the transmission frequency band as 1850 MHz to 1910 MHz and taking the receiving frequency band as 1930 MHz to 1990 MHz in the PSC (Personal Communication Services) band. In the case of a CDMA system in Japan, a high-frequency side filter element and a low-frequency side filter element are respectively used for a transmitting filter element TX and a receiving filter element RX to set the pass band by taking the transmission frequency band as 887 MHz to 925 MHz and taking the receiving frequency band as 832 MHz to 870 MHz. This setting allows for application as a duplexer used for this communication system.

The present invention is not limited to the above-mentioned embodiment. Various changes and improvements may be made without departing from the scope of the present invention. For example, the filter element may include the configuration of a DMS (Double Mode SAW) filter element, a lattice type filter element, or the like. The filter element may comprise at least one series IDT electrode and one parallel IDT electrode.

Furthermore, arbitrary mounting form may be used in mounting the surface acoustic wave device according to the present invention on a mounting substrate such as an electronic circuit module. Not only the above-mentioned CSP (Chip Size Package) type but also various packaging types such as a wire bonding type and a flip-chip type are applicable.

A snake-shaped phase matching line or a matching circuit including an inductor and a capacitor can be also arranged within a circuit board in order to improve isolation between the receiving filter element RX and the transmitting filter element TX. The phase matching line or the matching circuit of the inductor and the capacitor functions to render a transmission signal that has passed through a transmitting filter element TX from a transmission terminal that a receiving filter element RX is electrically opened by bringing the impedance of the receiving filter element RX as viewed from an antenna terminal near to infinity in a band, overlapped with a transmission frequency band, in a receiving frequency band. As a result, the transmission signal can be outputted from the antenna terminal without increasing the loss.

EXAMPLES

A surface acoustic wave device shown in FIGS. 7 and 8 was manufactured.

In a surface acoustic wave element, a 38.7-degree Y-cut X-propagation lithium tantalate single crystal substrate was used as a piezoelectric substrate, and IDT electrodes 110 and 120 composed of an Al alloy of Al (99% by mass)-Cu (1% by mass), ground electrodes 312 and 322, signal input/output electrodes 311 and 321, and a wiring electrode and a grounding annular electrode 330 for electrically connecting the electrodes were formed on its main surface.

The electrodes were produced by forming an Al alloy thin film using a sputtering method, then subjecting the thin film to photolithography using a spin-coater, a stepper, a developer, etc., etching the thin-film by the RIE (Reactive Ion Etching) apparatus, etc. to form predetermined patterns.

A circuit board was produced by laminating a plurality of insulating layers. Ceramics (a dielectric constant 9) mainly composed of alumina was used for the insulating layers. The insulating layer was produced by producing a green sheet composed of ceramics or the like and providing the green sheet with a desired wiring pattern or via conductor, then laminating and pressing the green sheets to integrally form the green sheets, followed by sintering.

A conductor terminal or an annular conductor corresponding to each of the electrodes on the piezoelectric substrate was formed on an upper surface of the circuit board. A solder was formed on each of the conductor terminals and the annular conductors, to join the electrodes on the piezoelectric substrate.

Frequency characteristics against the respective signal attenuations of a transmitting filter element TX and a receiving filter element RX in a surface acoustic wave device manufactured in such a way were measured.

Figure 12:
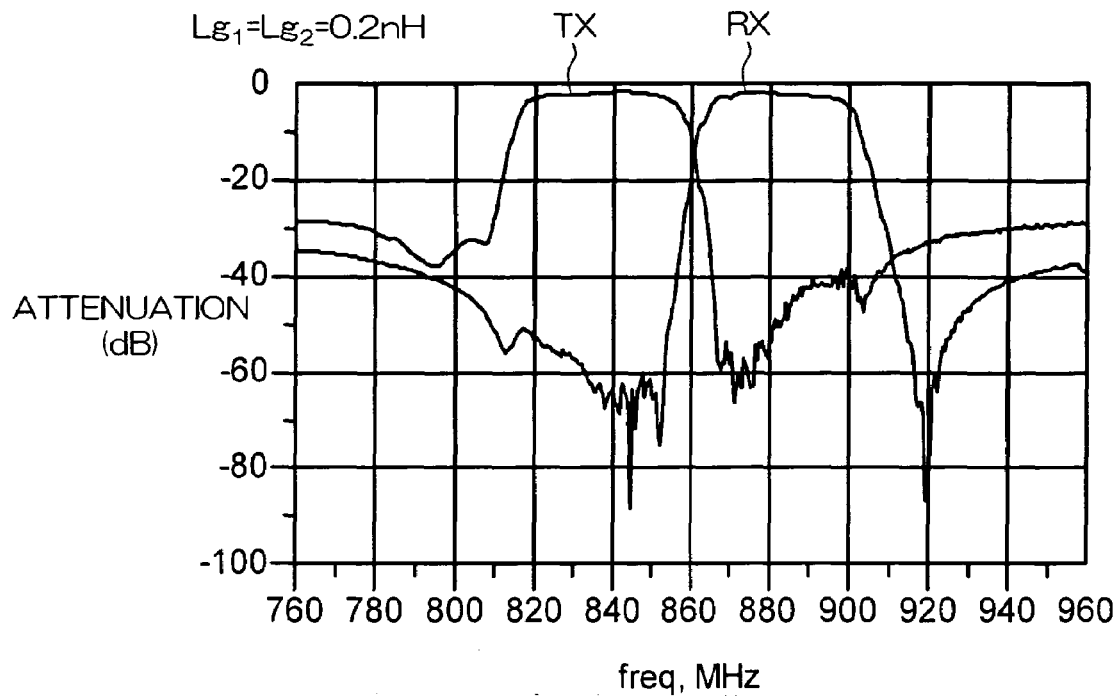
FIG. 12 is a graph obtained by measuring the signal attenuation of the transmitting filter element TX and the signal attenuation of the receiving filter element RX.
Figure 13:
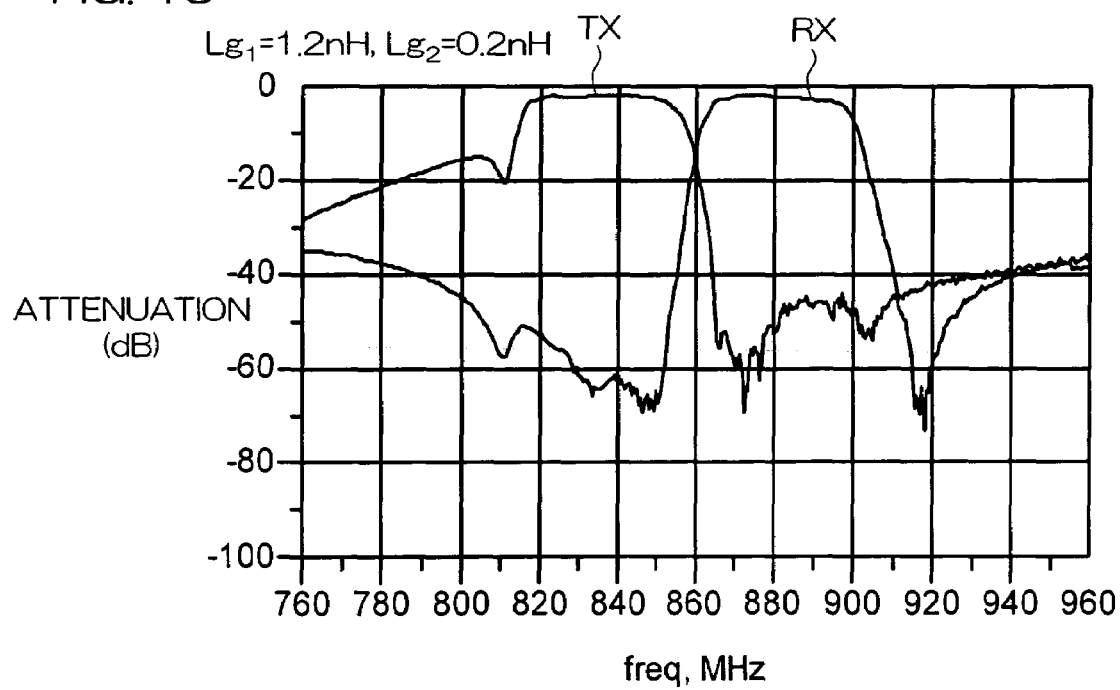
FIG. 13 is a graph obtained by measuring the signal attenuation of the transmitting filter element TX and the signal attenuation of the receiving filter element RX.

The results are shown in graphs in FIGS. 12 and 13. In the graph, a frequency is used to enter its horizontal axis, and a signal attenuation is used to enter its vertical axis.

FIG. 12 shows frequency characteristics in a comparative example in which both the ground inductance Lg1 of the transmitting filter element TX and the ground inductance Lg2 of the receiving filter element RX are set to 0.2 nH by making the respective numbers of grounding via conductors equal to each other. In FIG. 12, the signal attenuation of the transmitting filter element TX in a receiving band is 41.2 dB at 893 MHz.

FIG. 13 shows frequency characteristics in a case where the ground inductance Lg1 of the transmitting filter element TX is set to 1.2 nH, and the ground inductance Lg2 of the receiving filter element RX is set to 0.2 nH. As can be seen from FIG. 13, the signal attenuation of the transmitting filter element TX in a receiving band is 45.9 dB at 893 MHz. The difference in the attenuation is greatly improved to 4.7 dB, as compared with that in FIG. 12.

The foregoing results of the measurements indicate that a transmitting filter element and a receiving filter element having low loss and having sufficient attenuation characteristics outside a band can be realized on one piezoelectric substrate.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A surface acoustic wave device comprising:
    a piezoelectric substrate;
    a first filter element formed on one main surface of the piezoelectric substrate, and comprising first input/output electrodes, a first ground electrode, and a first IDT electrode;
    a second filter element formed on the same surface of the piezoelectric substrate, comprising second input/output electrodes, a second ground electrode, and a second IDT electrode, and having a different frequency band from the first filter element; and
    a circuit board for mounting the surface of the piezoelectric substrate,
    the first ground electrode and the second ground electrode being electrically separated from each other on the surface of the piezoelectric substrate,
    a first grounding conductor terminal connected to the first ground electrode and a second grounding conductor terminal connected to the second ground electrode being separated from each other on a surface, on which the piezoelectric substrate is mounted, of the circuit board,
    a third ground electrode being provided on a surface on the side opposite to the surface, on which the piezoelectric substrate is mounted, of the circuit board or any inner layer surface of the circuit board, and
    first and second via conductors respectively connected to the first grounding conductor terminal and the second grounding conductor terminal and penetrating the circuit board down to the position of the third ground electrode,
    wherein the first ground electrode is formed in a single electrode on the one main surface of the piezoelectric substrate, and the second ground electrode is formed in a single electrode on the one main surface of the piezoelectric substrate, and
    wherein the first IDT electrode comprises a series IDT electrode connected between the first input/output electrodes and parallel IDT electrodes connected between a signal line and the first ground electrode, and the second IDT electrode comprises a series IDT electrode connected between the second input/output electrodes, and parallel IDT electrodes connected between the signal line and the second ground electrode.

2. The surface acoustic wave device according to claim 1, wherein
    an annular electrode surrounding the first and second filter elements is formed on the surface, having the first and second filter elements formed thereon, of the piezoelectric substrate, and
    an annular conductor connected to the annular electrode is formed on the surface, on which the piezoelectric substrate is mounted, of the circuit board.

3. The surface acoustic wave device according to claim 2, wherein
    the annular electrode comprises two annular electrodes respectively surrounding the first and second filter elements, and
    the annular conductor is connected to the two annular electrodes.

4. The surface acoustic wave device according to claim 2, wherein
    the second ground electrode is connected to the annular electrode formed so as to surround the first and second filter elements on the surface, having the first and second filter elements formed thereon, of the piezoelectric substrate, and
    the second grounding conductor terminal is the annular conductor formed so as to be connected to the annular electrode on the surface, on which the piezoelectric substrate is mounted, of the circuit board.

5. A communication apparatus comprising:
    the surface acoustic wave device according to claim 1, and
    a transmission circuit using the surface acoustic wave device as a circuit element.

6. A communication apparatus comprising:
    the surface acoustic wave device according to claim 1, and
    a receiving circuit using the surface acoustic wave device as a circuit element.

7. A surface acoustic wave device comprising:
    a piezoelectric substrate;
    a first filter element formed on one main surface of the piezoelectric substrate, and comprising first input/output electrodes, a first ground electrode, and a first IDT electrode;
    a second filter element formed on the same surface of the piezoelectric substrate, comprising second input/output electrodes, a second ground electrode, and a second IDT electrode, and having a higher frequency band than the first filter element;
a circuit board for mounting the surface of the piezoelectric substrate;
the first ground electrode and the second ground electrode being electrically separated from each other on the surface of the piezoelectric substrate;
a first grounding conductor terminal connected to the first ground electrode and a second grounding conductor terminal connected to the second ground electrode being separated from each other on a surface, on which the piezoelectric substrate is mounted, of the circuit board;
a third ground electrode being provided on a surface on the side opposite to the surface, on which the piezoelectric substrate is mounted, of the circuit board or any inner layer surface of the circuit board; and
first and second via conductors respectively connected to the first grounding conductor terminal and the second grounding conductor terminal and penetrating the circuit board down to the position of the third ground electrode;
wherein
a series inductance of the first ground electrode, the first grounding conductor terminal, and the first via conductor is higher than a series inductance of the second ground electrode, the second grounding conductor terminal, and the second via conductor.

8. The surface acoustic wave device according to claim 7, wherein
the area on the piezoelectric substrate of the first ground electrode is smaller than the area on the piezoelectric substrate of the second ground electrode.

9. The surface acoustic wave device according to claim 7, wherein
the number of the first via conductors is smaller than the number of the second via conductors.

10. The surface acoustic wave device according to claim 7, wherein
the first via conductor has a crank shape.

11. The surface acoustic wave device according to claim 10, wherein
the second via conductor has a linear shape.

12. The surface acoustic wave device according to claim 7, wherein
the cross-sectional area of the first via conductor is smaller than the cross-sectional area of the second via conductor.

13. The surface acoustic wave device according to claim 7, wherein
the first IDT electrode has a series IDT electrode connected between the first input/output electrodes and a parallel IDT electrode connected between a signal line and the ground, and
the second IDT electrode has a series IDT electrode connected between the second input/output electrodes and a parallel IDT electrode connected between the signal line and the ground.

14. The surface acoustic wave device according to claim 7, wherein
an annular electrode surrounding the first and second filter elements is formed on the surface, having the first and second filter elements formed thereon, of the piezoelectric substrate, and
an annular conductor connected to the annular electrode is formed on the surface, on which the piezoelectric substrate is mounted, of the circuit board.

15. The surface acoustic wave device according to claim 14, wherein
the annular electrode comprises two annular electrodes respectively surrounding the first and second filter elements, and
the annular conductor is connected to the two annular electrodes.

16. The surface acoustic wave device according to claim 14, wherein
the second ground electrode is connected to the annular electrode formed so as to surround the first and second filter elements on the surface, having the first and second filter elements formed thereon, of the piezoelectric substrate, and
the second grounding conductor terminal is the annular conductor formed so as to be connected to the annular electrode on the surface, on which the piezoelectric substrate is mounted, of the circuit board.

17. A communication apparatus comprising:
the surface acoustic wave device according to claim 7, and
a transmission circuit using the surface acoustic wave device as a circuit element.

18. A communication apparatus comprising: the surface acoustic wave device according to claim 7, and
a receiving circuit using the surface acoustic wave device as a circuit element.

19. A surface acoustic wave device comprising:
a piezoelectric substrate;
a first filter element formed on one main surface of the piezoelectric substrate, and comprising first input/output electrodes, a first ground electrode, and a first IDT electrode;
a second filter element formed on the same surface of the piezoelectric substrate, comprising second input/output electrodes, a second ground electrode, and a second IDT electrode, and having a different frequency band from the first filter element;
a circuit board for mounting the surface of the piezoelectric substrate,
the first ground electrode and the second ground electrode being electrically separated from each other on the surface of the piezoelectric substrate;
an annular electrode surrounding the first and second filter elements formed on the surface, having the first and second filter elements formed thereon, of the piezoelectric substrate,
a first grounding conductor terminal connected to the first ground electrode and a second grounding conductor terminal connected to the second ground electrode being separated from each other on a surface, on which the piezoelectric substrate is mounted, of the circuit board;
an annular conductor formed so as to be connected to the annular electrode is provided on the surface, on which the piezoelectric substrate is mounted, of the circuit board, the annular conductor being connected to the second grounding conductor of the circuit board;
a third ground electrode being provided on a surface on the side opposite to the surface, on which the piezoelectric substrate is mounted, of the circuit board or any inner layer surface of the circuit board; and a via conductor connected to the annular conductor and penetrating the circuit board down to the position of the third ground electrode is provided.

20. A surface acoustic wave device comprising:

a piezoelectric substrate;

a first filter element formed on one main surface of the piezoelectric substrate, and comprising first input/output electrodes, a first ground electrode, and a first IDT electrode;

a second filter element formed on the same surface of the piezoelectric substrate, comprising second input/output electrodes, a second ground electrode, and a second IDT electrode, and having a different frequency band from the first filter element;

a circuit board for mounting the surface of the piezoelectric substrate;

the first ground electrode and the second ground electrode being electrically separated from each other on the surface of the piezoelectric substrate;

an annular electrode surrounding the first and second filter elements formed on the surface, having the first and second filter elements formed thereon, of the piezoelectric substrate, the annular electrode being connected to the second ground electrode;

a first grounding conductor terminal connected to the first ground electrode on a surface, on which the piezoelectric substrate is mounted, of the circuit board;

an annular conductor formed so as to be connected to the annular electrode being provided on the surface, on which the piezoelectric substrate is mounted, of the circuit board;

a third ground electrode being provided on a surface on the side opposite to the surface, on which the piezoelectric substrate is mounted, of the circuit board or any inner layer surface of the circuit board; and a via conductor connected to the annular conductor and penetrating the circuit board down to the position of the third ground electrode is provided.

* * * * *